(12) United States Patent
Van Zyl et al.

(10) Patent No.: US 9,660,613 B2
(45) Date of Patent: May 23, 2017

(54) IMPEDANCE-MATCHING NETWORK USING BJT SWITCHES IN VARIABLE-REACTANCE CIRCUITS

(71) Applicant: Advanced Energy Industries, Inc., Fort Collins, CO (US)

(72) Inventors: Gideon Van Zyl, Fort Collins, CO (US); Gennady G. Gurov, Loveland, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 14/820,400

(22) Filed: Aug. 6, 2015

(65) Prior Publication Data

US 2015/0349750 A1    Dec. 3, 2015

Related U.S. Application Data

(63) Continuation of application No. 13/786,813, filed on Mar. 6, 2013, now Pat. No. 9,124,248, which is a
(Continued)

(51) Int. Cl.
*H01J 37/32* (2006.01)
*H03H 11/30* (2006.01)
(Continued)

(52) U.S. Cl.
CPC ....... *H03H 11/30* (2013.01); *H01J 37/32183* (2013.01); *H03H 5/12* (2013.01);
(Continued)

(58) Field of Classification Search
None
See application file for complete search history.

(56) References Cited

U.S. PATENT DOCUMENTS

RE27,045 E      2/1971  Ya
5,382,916 A *   1/1995  King .................. G05F 3/30
                                              257/E27.015
(Continued)

FOREIGN PATENT DOCUMENTS

JP    63258110 A    10/1988
JP    11-177401      7/1999
(Continued)

OTHER PUBLICATIONS

Non Patent Literature Class E RF amplfiers by Sokal et al.*
(Continued)

*Primary Examiner* — Douglas W Owens
*Assistant Examiner* — Srinivas Sathiraju
(74) *Attorney, Agent, or Firm* — Neugeboren O'Dowd PC

(57) ABSTRACT

This disclosure describes systems, methods, and apparatuses for impedance-matching radio frequency power transmitted from a radio frequency generator to a plasma load in a semiconductor processing chamber. Impedance-matching can be performed via a match network having a variable-reactance circuit. The variable-reactance circuit can comprise one or more reactive elements all connected to a first terminal and selectively shorted to a second terminal via a switch. The switch can comprise a bipolar junction transistor (BJT) or insulated gate bipolar transistor (IGBT) controlled via bias circuitry. In an on-state, the BJT base-emitter junction is forward biased, and AC is conducted between a collector terminal and a base terminal. Thus, AC passes through the BJT primarily from collector to base rather than from collector to emitter. Furthermore, the classic match network topology used with vacuum variable capacitors can be modified such that voltages do not overload the BJT's in the modified topology.

19 Claims, 20 Drawing Sheets

Related U.S. Application Data continuation of application No. 13/010,647, filed on Jan. 20, 2011, now Pat. No. 8,416,008.

(51) Int. Cl.

| | | |
|---|---|---|
| *H03H 5/12* | (2006.01) | |
| *H03H 7/38* | (2006.01) | |
| *H03K 17/16* | (2006.01) | |
| *H03K 17/60* | (2006.01) | |
| *H03K 17/68* | (2006.01) | |
| *H05H 1/46* | (2006.01) | |

(52) U.S. Cl.
CPC .............. *H03H 7/38* (2013.01); *H03K 17/16* (2013.01); *H03K 17/60* (2013.01); *H03K 17/68* (2013.01); *H05H 1/46* (2013.01); *H05H 2001/4682* (2013.01)

(56) References Cited

U.S. PATENT DOCUMENTS

| | | | | |
|---|---|---|---|---|
| 5,528,058 A * | 6/1996 | Pike, Jr. | ............... | H01L 21/033 257/142 |
| 5,815,047 A | 9/1998 | Sorensen et al. | | |
| 6,424,232 B1 | 7/2002 | Mavretic et al. | | |
| 6,750,711 B2 * | 6/2004 | Chawla | ................... | H03F 3/193 330/207 A |
| 6,794,951 B2 * | 9/2004 | Finley | .................... | H03H 11/28 333/17.3 |
| 6,965,267 B2 * | 11/2005 | Delorme | ................... | H03F 1/56 327/478 |
| 7,180,758 B2 * | 2/2007 | Lincoln | ................. | H02H 7/122 363/56.01 |
| 7,286,024 B2 * | 10/2007 | Khannur | .............. | H03B 5/1203 331/117 R |
| 7,777,567 B2 * | 8/2010 | Polizzo | ............ | H01J 37/32082 315/111.21 |
| 8,406,711 B2 * | 3/2013 | Sorrells | .................... | H03C 5/00 455/114.3 |
| 8,416,008 B2 * | 4/2013 | Van Zyl | ............ | H01J 37/32183 327/427 |
| 8,428,527 B2 * | 4/2013 | Sorrells | .................... | H03C 5/00 455/102 |
| 8,433,264 B2 * | 4/2013 | Sorrells | .................... | H03C 5/00 455/127.1 |
| 8,647,585 B2 * | 2/2014 | Hancock | ................... | A61L 2/14 422/186 |
| 9,124,248 B2 * | 9/2015 | Van Zyl | ............. | H01J 37/32183 |
| 9,196,459 B2 * | 11/2015 | Bhutta | .............. | H01J 37/32183 |
| 9,287,086 B2 * | 3/2016 | Brouk | ................... | C23C 14/345 |
| 9,337,804 B2 * | 5/2016 | Mason | .............. | H01J 37/32183 |
| 2006/0158911 A1 * | 7/2006 | Lincoln | ................. | H02H 7/122 363/56.01 |
| 2007/0206395 A1 * | 9/2007 | Lincoln | ................. | H02H 7/122 363/56.1 |
| 2008/0284537 A1 | 11/2008 | Ikenouchi | | |
| 2010/0174420 A1 | 7/2010 | Van Zyl | | |
| 2011/0260292 A1 * | 10/2011 | Lin | ....................... | H01L 29/405 257/565 |
| 2012/0112815 A1 * | 5/2012 | Mason | .............. | H01J 37/32183 327/419 |
| 2012/0318456 A1 * | 12/2012 | Brouk | .............. | H01J 37/32009 156/345.28 |
| 2013/0193867 A1 * | 8/2013 | Van Zyl | ............ | H01J 37/32183 315/240 |

FOREIGN PATENT DOCUMENTS

| | | |
|---|---|---|
| JP | 2000512460 A | 9/2000 |
| JP | 2003086602 | 3/2003 |
| JP | 2003115549 A | 4/2003 |
| JP | 2004027339 A | 1/2004 |
| JP | 2004085446 A | 3/2004 |

OTHER PUBLICATIONS

The Korean Intellectual Property Office, "Korean Office Action re Application No. 1020137020864", Oct. 16, 2015, p. 6, Published in: KR.
Chinese Patent Office, "Chinese Office Action re Application No. 201280014097.0", Dec. 21, 2015, p. 6, Published in: CN.
Japanese Patent Office, "Japanese Office Action re Application No. 2013-550502", Jan. 12, 2016, p. 6, Published in: JP.
Yamamoto, Shusaku, "Response to Japanese Office Action re Application No. 2013-550502", Mar. 8, 2016, p. 10, Published in: JP.
SIPO, "Chinese Office Action re Application No. 201280014097.0", Jun. 3, 2015, p. 26, Published in: CN.
Cheng, Diana, "Office Action re U.S. Appl. No. 13/786,813", Dec. 4, 2014, p. 22, Published in: US.
Huber, et al, "InP/InGaAs Single HBT Technology for Photoreceiver OEIC's at 40 Gb/s and Beyond", Aug. 2000, p. 8, Publisher: IEEE Journal of Lightware Technology, Published in: US.
Fujimoto, Kayoko, "Japanese Office Action re Application No. 2013-550502", Jul. 1, 2015, p. 10, Published in: JP.
Fujimoto, "Japanese Office Action re Application No. 2013-550502", Dec. 16, 2014, p. 9, Published in: JP.
Cheng, Diana, "Office Action re U.S. Appl. No. 13/786,813", Apr. 10, 2014, p. 32, Published in: US.
Cheng, Diana, "Office Action re U.S. Appl. No. 13/010,647", Aug. 16, 2012, p. 18, Published in: US.
Cheng, Diana, "Office Action re U.S. Appl. No. 13/786,813", Sep. 18, 2013, p. 26, Published in: US.
Carpenter, Robert K., "Office Action re U.S. Appl. No. 14/010,599", Oct. 6, 2014, p. 8, Published in: US.
Carpenter, Robert K., "Office Action re U.S. Appl. No. 14/010,599", Nov. 20, 2014, p. 28, Published in: US.
Carpenter, Robert K., "Office Action re U.S. Appl. No. 14/010,599", Jul. 16, 2015, p. 26, Published in: US.
Gruber, Stephen S., "Response to Office Action re U.S. Appl. No. 14/010,599", Feb. 19, 2015, p. 15, Published in: US.
Gruber, Steohen S., "Response to Office Action re U.S. Appl. No. 14/010,599", Oct. 10, 2014, p. 6, Published in: US.
Gruber, Stephen S., "Response to Office Action re Application No. 13/010,647", Nov. 12, 2012, p. 13, Published in: US.
Mitrovic, Bayer, "International Search Report and Written Opinion re Application No. PCT/US12/21114", Feb. 22, 2012, p. 9, Published in: AU.
Bai, Lingfei, "International Preliminary Report on Patentability re Application No. PCT/US2012/021114", Aug. 1, 2013, p. 7, Published in: CH.
Dixit, Arpit, "International Search Report and Written Opinion re Application No. PCT/US2013/056895", Aug. 13, 2014, p. 9, Published in: AU.
Moon, Kihwan, "International Preliminary Report on Patentability re Application No. PCT/US2013/056895", Mar. 12, 2015, p. 6, Published in: CH.
Gruber, Stephen S., "Office Action Response re U.S. Appl. No. 14/010,599", Sep. 1, 2015, p. 10, Published in: US.
Gruber, Stephen S., "Response to Office Action re U.S. Appl. No. 13/786,813", Sep. 10, 2014, p. 20, Published in: US.
Gruber, Stephen S., "Response to office Action re U.S. Appl. No. 13/786,813", Dec. 13, 2013, p. 12, Published in: US.
Gruber, Stephen S., "Response to Office Action re U.S. Appl. No. 13/786,813", Feb. 4, 2015, p. 16, Published in: US.
Sokal, Nathan O., "Class-E RF Power Amplifiers", "QEX", Jan. 2, 2001, pp. 9-20, Publisher: ARRL—American Radio-Relay League, Published in: US.
Tai E International Patent & Law Office, "Taiwan Office Action re Application No. 101100152", Jun. 9, 2015, p. 3, Published in: TW.

\* cited by examiner

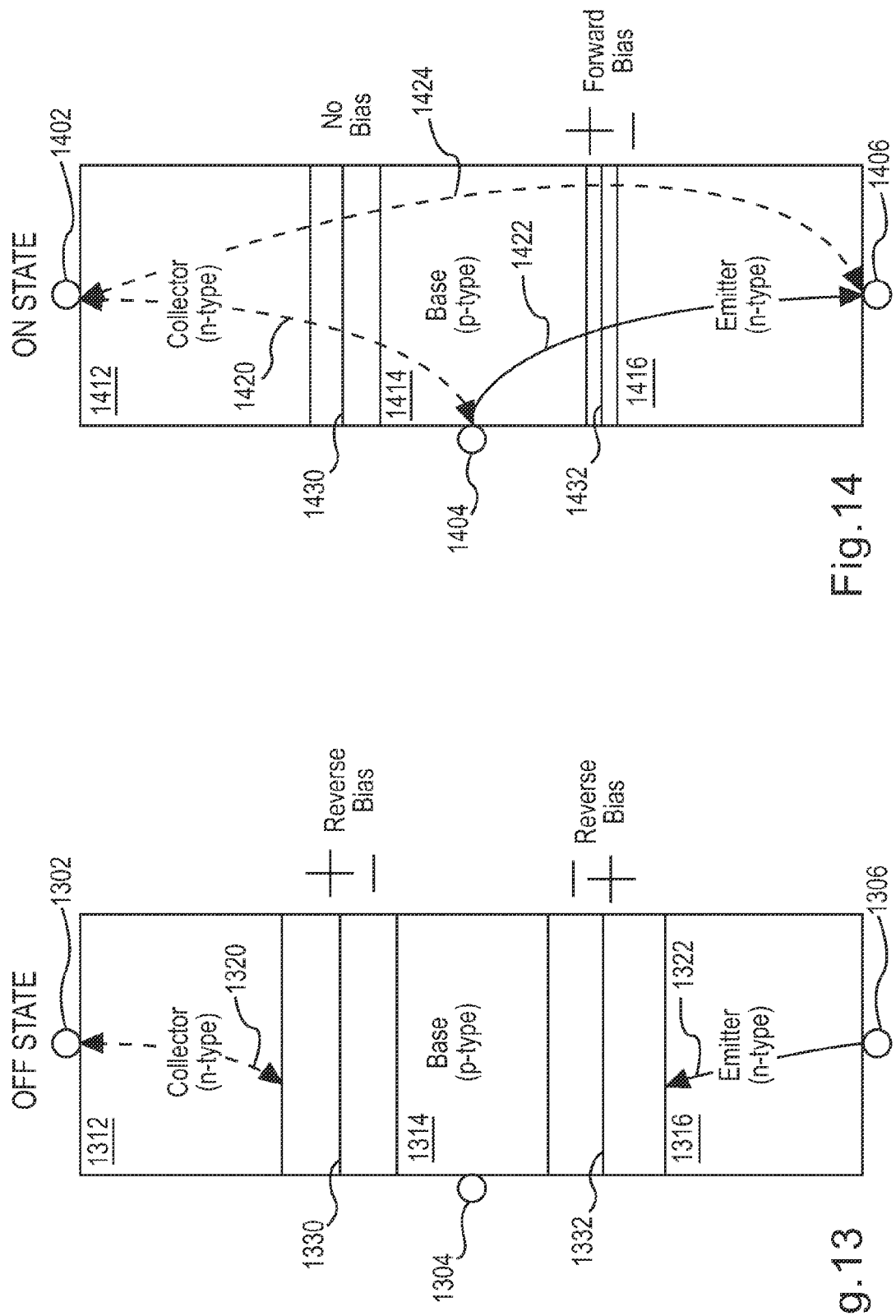

IMPEDANCE-MATCHING NETWORK USING BJT SWITCHES IN VARIABLE-REACTANCE CIRCUITS

CLAIM OF PRIORITY UNDER 35 U.S.C. §120

The present Application for Patent is a continuation of Nonprovisional application Ser. No. 13/786,813 entitled "Impedance-Matching Network Using BJT Switches in Variable-Reactance Circuits" filed Mar. 6, 2013, which is a continuation of Nonprovisional U.S. Pat. No. 8,416,008 entitled "Impedance-Matching Network Using BJT Switches in Variable-Reactance Circuits" filed Jan. 20, 2011. Both of these are assigned to the assignee hereof and hereby expressly incorporated by reference herein.

FIELD OF THE INVENTION

The present invention relates generally to plasma processing. In particular, but not by way of limitation, the present invention relates to systems, methods and apparatuses for impedance-matching radio frequency power transmitted from a radio frequency generator to a plasma load in a semiconductor processing chamber.

BACKGROUND OF THE INVENTION

In the semiconductor manufacturing world, manufacturers produce plasma processing chambers that utilize radio frequency (RF) power to generate a plasma. In order to achieve efficient power transfer between the RF generator ("generator") and the plasma load, an impedance-matching network ("match network") is often used to match the load impedance to a desired input impedance, typically 50 ohm. Plasma load impedance may vary depending on variables such as generator frequency, power, chamber pressure, gas composition, and plasma ignition. The match network accounts for these variations in load impedance by varying electrical elements, typically vacuum variable capacitors, internal to the match to maintain the desired input impedance.

FIG. 1 illustrates a typical generator, match network, and plasma load system. The generator 102 transmits RF power to the match network 104 via a transmission line 108 (e.g., coaxial cable) and then onto the plasma load 106 via an electrical connection 110. The match network 104 varies its internal electrical elements such that the input impedance of the match network 104 is close to the desired input impedance. Match networks typically only contain reactance elements, meaning elements that store energy in electrical and magnetic fields as opposed to resistive elements that dissipate electrical power. The most common reactance elements are capacitors, inductors and coupled inductors but others such as distributed circuits are also used. Match networks can also include lossless elements including transmission lines and transformers. The only resistive elements in a match network are typically associated with losses in non-ideal reactive and lossless components or components that do not take part in the impedance transformation such as components for sensing voltage, current, power or temperature.

Match networks can comprise a number of variable reactance elements. To match a load impedance that can vary over a certain impedance range to a desired input impedance, the prior art typically uses at least two variable reactance elements, or a combination of a variable generator frequency and a single variable reactance element. Alternatively, if a certain input impedance mismatch can be tolerated, a single variable reactance element in combination with a generator having a fixed frequency or a fixed match with a variable frequency generator may be used. The variable reactance elements are often variable capacitors, variable inductors, or a combination of the two. For instance, sets of switches, capacitors, and inductors can be used to form a match network. Vacuum variable capacitors are one example of a variable reactance element. Variable capacitors can be arranged between two terminals via parallel connections of fixed capacitors selectively shorted to the second terminal via a switch. Capacitance is thus altered by switching one or more of the switches thus varying the effective capacitance between the two terminals.

FIG. 2 illustrates one embodiment of a match network comprising one switched variable capacitor circuit. The switched variable capacitor 200 is formed via a group of fixed capacitors, the first indicated by 220 and the last by 222. The switched variable capacitor 200 typically contains between one and one hundred fixed capacitors all connected to a first terminal 202 and selectively connected to a second terminal 204. Switches, of which the first is indicated by 230 and the last by 232, selectively control which fixed capacitors are connected to the second terminal 204. Varying the number of fixed capacitors connected to the second terminal 204 varies the net effective capacitance of the switched capacitor 200. To match the plasma load 106 impedance to a desired input impedance the match network 104 also contains a fixed inductor 210 and a second variable capacitor 212 which may for example be of the vacuum variable type.

One example of switches 230, 232 is a PIN diode. PIN diodes are PN diodes with a lightly-doped intrinsic semiconductor region between the p and n-doped regions. PIN diodes have been used as switches in match network variable capacitors, because they have low losses in both the on and off-state, can handle high current in the on-state, and can handle high voltage in the off-state. PIN diodes achieve these characteristics by virtue of their unique operation at RF frequencies. In the off-state, the intrinsic region is largely devoid of carriers and this along with its large width gives the intrinsic region high resistance. As a result, the intrinsic region is loath to pass direct current (DC) and thus has low DC leakage current. Similarly, the intrinsic region bounded by the charges in the doped regions acts as a low capacitance capacitor, thus presenting a high impedance to alternating current (AC). The large width of the intrinsic region also allows the PIN diode to withstand high voltages in the off-state.

In the on-state, a PIN diode is forward biased, and holes from the p-region and electrons from the n-region are injected into the intrinsic region. Due to the long carrier lifetime in the intrinsic region many of these carriers do not recombine even if a reverse voltage is applied for a sufficiently short period of time and thus they make the intrinsic region highly conductive to AC with sufficiently high frequency. Hence, the PIN diode has very low losses in the on-state when AC with sufficiently high frequency is applied. This conductivity increases as greater DC bias is applied—as more carriers are injected into the intrinsic region. Further, the carrier lifetime in the intrinsic region is longer than the RF cycle, so rather than being swept out of the intrinsic region, carriers are rocked back and forth within it via the RF field. This property allows the PIN diode to see very little losses when RF current passes through it in the on-state.

However, PIN diodes are very expensive and only have two terminals. Thus, the RF current and the DC control current must enter via the same terminal requiring complicated, expensive, and bulky circuitry (e.g., inductors) to isolate the DC control source from the RF source.

SUMMARY

This disclosure describes systems, methods, and apparatuses for impedance-matching radio frequency power transmitted from a radio frequency generator to a plasma load in a semiconductor processing chamber. The match network comprises a variable-reactance circuit. The variable-reactance circuit comprises one or more reactive elements all connected to one terminal and each selectively shorted to a second terminal via a respective switch (or via more than one switch). Each switch comprises a bipolar junction transistor (BJT) or insulated gate bipolar transistor (IGBT) controlled via bias circuitry. In an on-state, the BJT base-emitter junction is forward biased, and AC is conducted between the collector and the base. Thus, AC passes through the BJT primarily from collector to base rather than from collector to emitter.

Even though the BJT can handle high voltage, its voltage-handling threshold may not be as great as that of a vacuum variable capacitor. As a result, the classic topologies suitable for using vacuum variable capacitors may be adapted to lower the voltage that the BJT experiences in the match network during normal operation.

One aspect of the present disclosure is a switch circuit having a bipolar junction transistor (BJT) and a biasing circuit. The BJT can have a collector terminal, a base terminal, an emitter terminal, a base-collector junction, and a base-emitter junction. The collector terminal can be connected to a collector of the BJT, and have a collector current passing through the collector terminal with an alternating current component having a first amplitude. The base terminal can be connected to a base of the BJT, and have a base current passing through the base terminal with an alternating current component having a second amplitude. The emitter terminal can be connected to an emitter of the BJT, and have an emitter current passing through the emitter terminal with an alternating current component having a third amplitude.

The biasing circuit can establish an on-state and an off-state of the BJT. The biasing circuit can establish the on-state of the BJT by forward biasing the base-emitter junction such that the second amplitude is greater than the third amplitude. The biasing circuit can establish the off-state of the BJT by reverse biasing the base-emitter junction and the base-collector junction.

In another aspect of the disclosure, an impedance-matching apparatus has at least one variable reactance element and a fixed impedance-matching section. The impedance-matching apparatus can be arranged between a generator and a plasma load. The at least one variable reactance element can have a first terminal, a second terminal, at least one reactive element connected to the first terminal, and at least one switch circuit configured to selectively connect the at least one reactive element to the second terminal. When the at least one switch circuit is closed, thereby connecting the at least one reactive element to the second terminal, it alters a reactance between the first terminal and the second terminal.

The at least one switch circuit can include a BJT. The BJT can have, or be configured to operate in, an on-state and an off-state. In the on-state, a base-emitter junction of the BJT can be forward biased. An AC component of a first current through a base terminal of the BJT can be greater than an AC component of a second current through an emitter terminal of the BJT. In the off-state, both the base-emitter junction and a base-collector junction of the BJT can be reverse biased. The fixed impedance-matching section can be in cascade with the at least one variable reactance element, and can be configured to be arranged in cascade with a plasma load. The fixed impedance-matching section can include one or more shunt elements and one or more series elements in a ladder network, where the one or more shunt and series elements can be configured in a one or multi-port network. Alternatively, the fixed impedance-matching section can include at least two Darlington sections.

Another aspect of the disclosure is a method including the following operations: forward biasing a base-emitter junction of a BJT; conducting a first current through the BJT between a collector terminal of the BJT and a base terminal of the BJT, wherein the first current has an alternating current component with a first amplitude; and conducting a second current through the BJT between the collector terminal of the BJT and an emitter terminal of the BJT, wherein the second current has an alternating current component with a second amplitude, and wherein the second amplitude is less than the first amplitude and equal to or greater than zero.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 13 illustrates a cross section of an n-p-n BJT operated in the off-state.

FIG. 14 illustrates a cross section of an n-p-n BJT operated in the on-state described in this disclosure.

DETAILED DESCRIPTION

This disclosure will begin with a discussion of the problems faced, unexpected results discovered, and proposed device physics to explain the unexpected results.

A device is needed that can fulfill the role of a PIN diode as a switch for shorting capacitors or other reactive circuits between two terminals in order to create a variable reactance element for use in an impedance-matching network. This device should have low losses in both the on and off-states. It should also handle high voltage in the off-state and high current in the on-state. Switching control should be enabled via a terminal other than a terminal that passes RF current, thereby avoiding complicated, bulky, and expensive isolation circuitry. Unexpectedly these goals are achieved via a previously undiscovered bipolar junction transistor (BJT) mode of operation as described herein.

Figure 1:
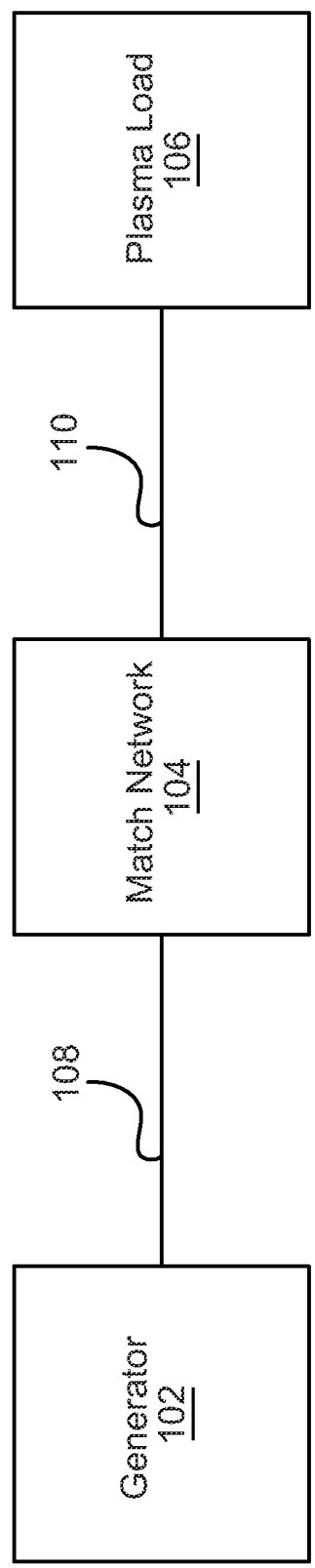
FIG. 1 illustrates a typical generator, match network, and plasma load system.
Figure 2:
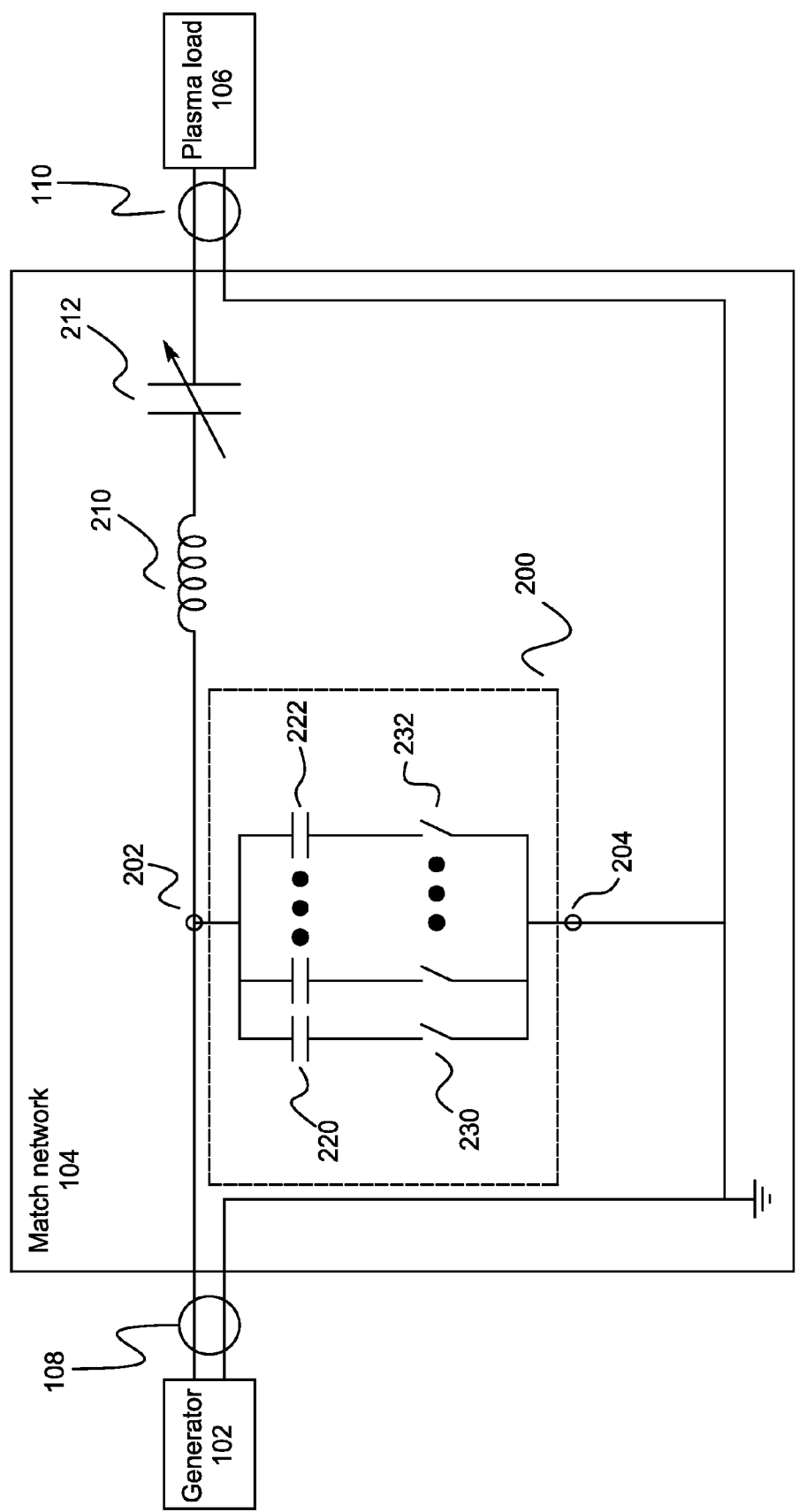
FIG. 2 illustrates one embodiment of a match network comprising a variable capacitor circuit.
Figure 3:
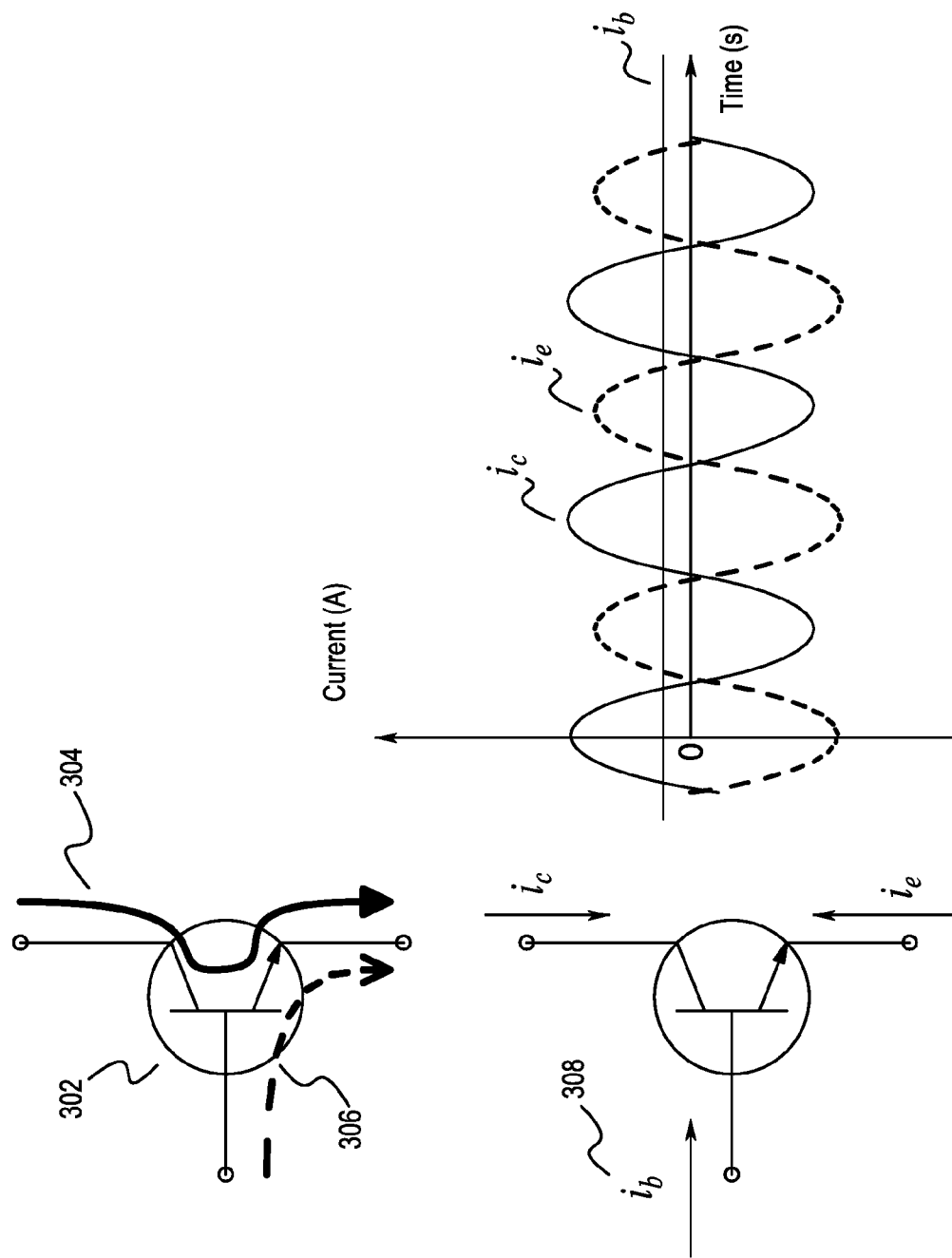
FIG. 3 illustrates the prior art for using a BJT as a switch.
Figure 4:
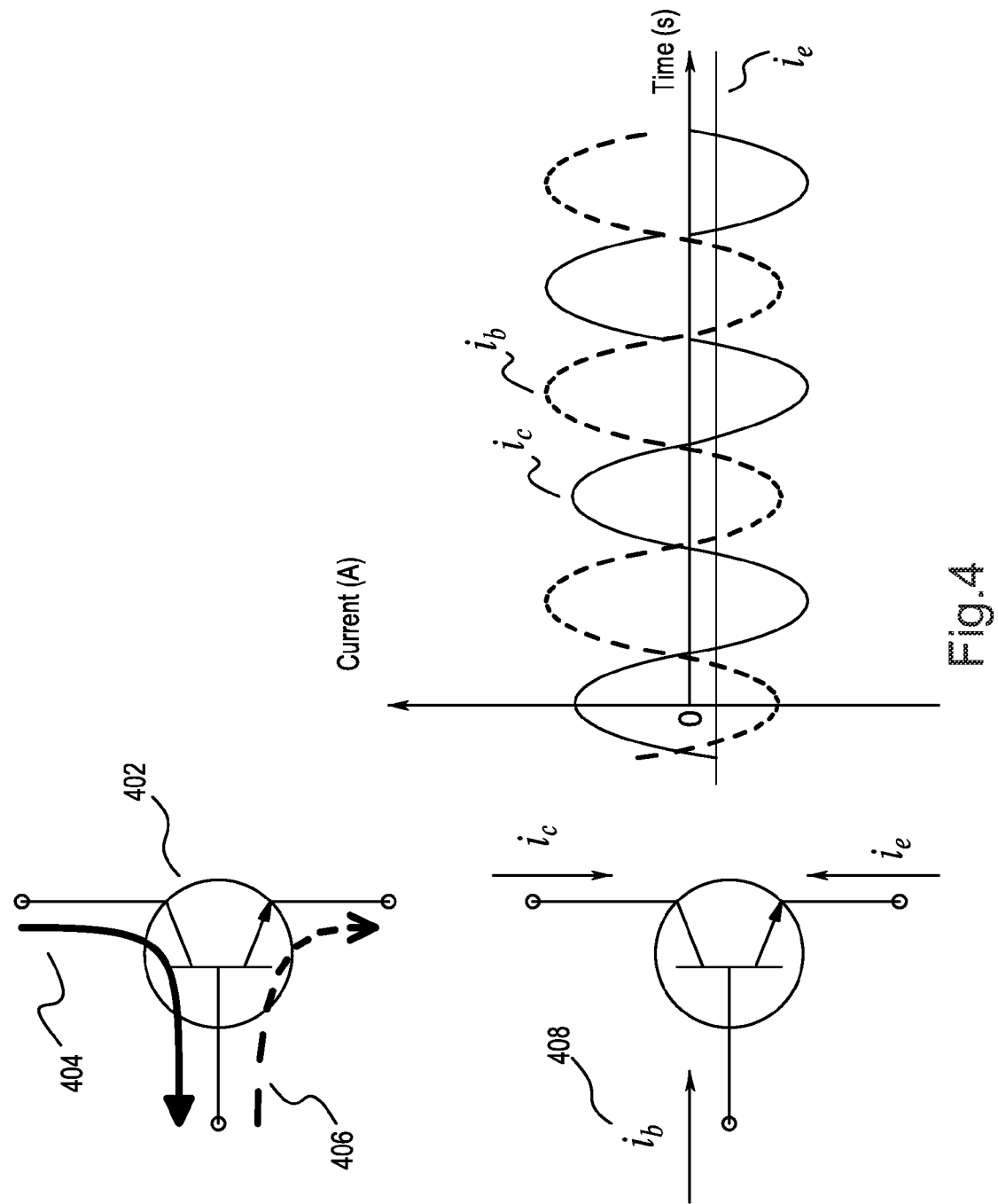
FIG. 4 illustrates an embodiment of a new BJT mode of operation using a BJT as an effective switch.

Typically, a BJT operated as a switch, conducts current between collector and emitter in an on-state, and blocks the flow of current between collector and emitter in an off-state. In this known mode of operation the base current is used as a control current and is a fraction of the current that is conducted between collector and emitter in the on-state of the switch. In this normal configuration the switch uses cutoff as the off-state (appears as an open circuit) and saturation as the on-state (appears as a short circuit). Yet, this disclosure describes a new way of operating the BJT as a switch where, in an on-state of the switch current is conducted between collector and base and in an off-state current flow between collector and base is blocked. In this mode of operation the emitter current is used as the control current to turn the switch on or off. What makes this mode of operation strikingly different from any known way of operating the BJT is that the base current has a large alternating current (AC) component so that current flows both into and out of the base whereas the well-known Ebers-Moll equations that describe the basic operation of a BJT allow only for a base current flowing into the base terminal for a n-p-n BJT transistor and out of the base terminal for a p-n-p BJT transistor. Of course, under dynamic conditions, current can flow out of the base of a n-p-n transistor in a conventional switch circuit due to the device capacitances being charged or discharged, but in this newly discovered mode of operation the base current has a deliberately large AC component unlike any known mode of operation for the BJT. The distinction between the prior art and the new mode of operating the BJT is apparent via comparison of the prior art in FIG. 3 and the new mode of operation in FIG. 4. In the prior art as illustrated in FIG. 3, the current 304 that the BJT 302 controls flows mainly from collector to emitter and the base current 308 mainly consists of the control current 306. By contrast as illustrated in FIG. 4, in the new operating mode of the BJT, the current 404 that the BJT 402 controls flows mainly from collector to base and the base current 408 is the sum of the controlled current 404 and the control current 406 and has a large AC component that generally exceeds the DC component so that the large AC component is the dominant component of the base current.

It was experimentally found that a small DC applied between the base and emitter can control a large AC current between collector and base. In this mode the on-state losses are remarkably low and it is believed that the operation of the device in this mode is similar to that of a PIN diode where the AC current sweeps injected carriers in the collector and base regions back and forth and the DC emitter current keeps the collector and base regions supplied with carriers. If the DC emitter current is interrupted and the collector voltage is pulled up (down for a p-n-p BJT) even with a very large resistor, the flow of current between collector and base can be interrupted and the collector base junction reverse biased providing a high impedance to the flow of current from collector to base creating a low loss off-state. Some BJT devices that achieve low losses in the on-state can handle up to 1600 V in the off-state. Because of the small collector base capacitance if the collector is pulled up to around 800 V, they can also see low off-state losses. So, a BJT operated in the switching mode herein disclosed achieves the low losses and high current-carrying capacity of a PIN diode in the on-state and the low leakage current and high voltage capacity of a PIN diode in the off-state. However, it does so via a three-terminal device, thus avoiding the complex isolation circuitry that a PIN diode requires to isolate the DC control signal from the RF signal.

Figure 5:
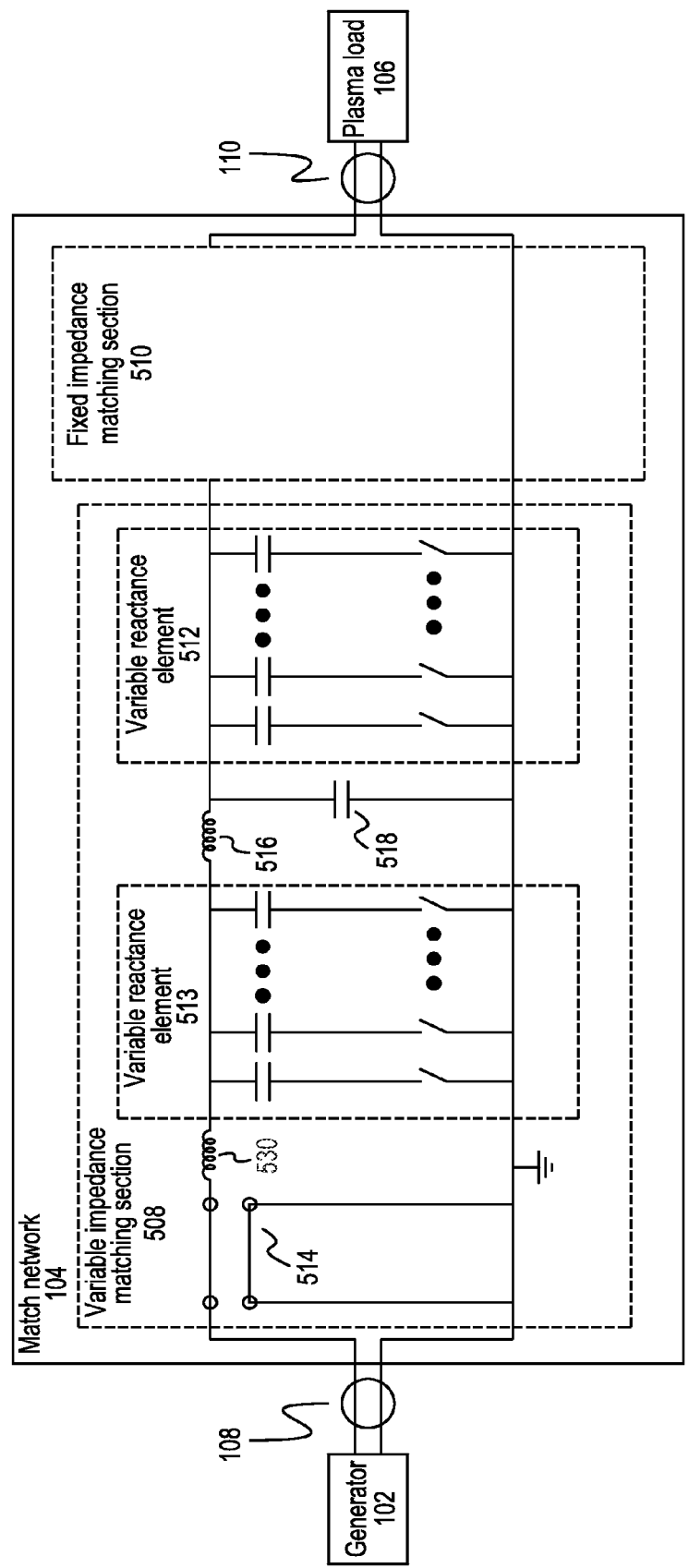
FIG. 5 illustrates an embodiment of building blocks for creating a match network using a BJT switch circuit according to the systems and methods herein disclosed.

FIG. 5 illustrates a match network for impedance-matching a RF power source to a plasma load that makes use of the switch technology described herein. The match network 104 receives power from an RF power generator 102 and passes the power to the plasma load 106. The match network 104 comprises a variable impedance-matching section 508 cascaded with a fixed impedance-matching section 510.

The fixed impedance-matching section 510 transforms the impedance presented by the plasma load 106 to an impedance more suitable to the limited voltage and current handling capability of the components of the variable impedance-matching section. The variable impedance-matching section contains fixed elements that can handle the voltage and current imposed by the plasma load impedance and the power delivered to it and may consist of fixed capacitors, inductors and distributed circuits. Despite the use of a fixed impedance-matching section 510 to reduce the voltage that the BJT switches have to handle, extra precautions such as detection of overvoltage conditions, voltage limiting circuits to protect the switches against momentary overvoltage and algorithms that turn on the BJT switches to protect against sustained overvoltage condition may be required depending on the application.

The variable impedance-matching section 508 has at least one switched variable reactance element 512 that can be arranged with any number of fixed reactance elements such as fixed inductor 516, fixed optional inductor 530, transmission line 514 and capacitor 518. The variable impedance-matching section 508 can contain any number of fixed lumped and distributed elements and circuits. The illustrated match network 104 contains two switched variable reactance elements 512 and 513, although more than two switched variable reactance elements can be used.

Figure 6:
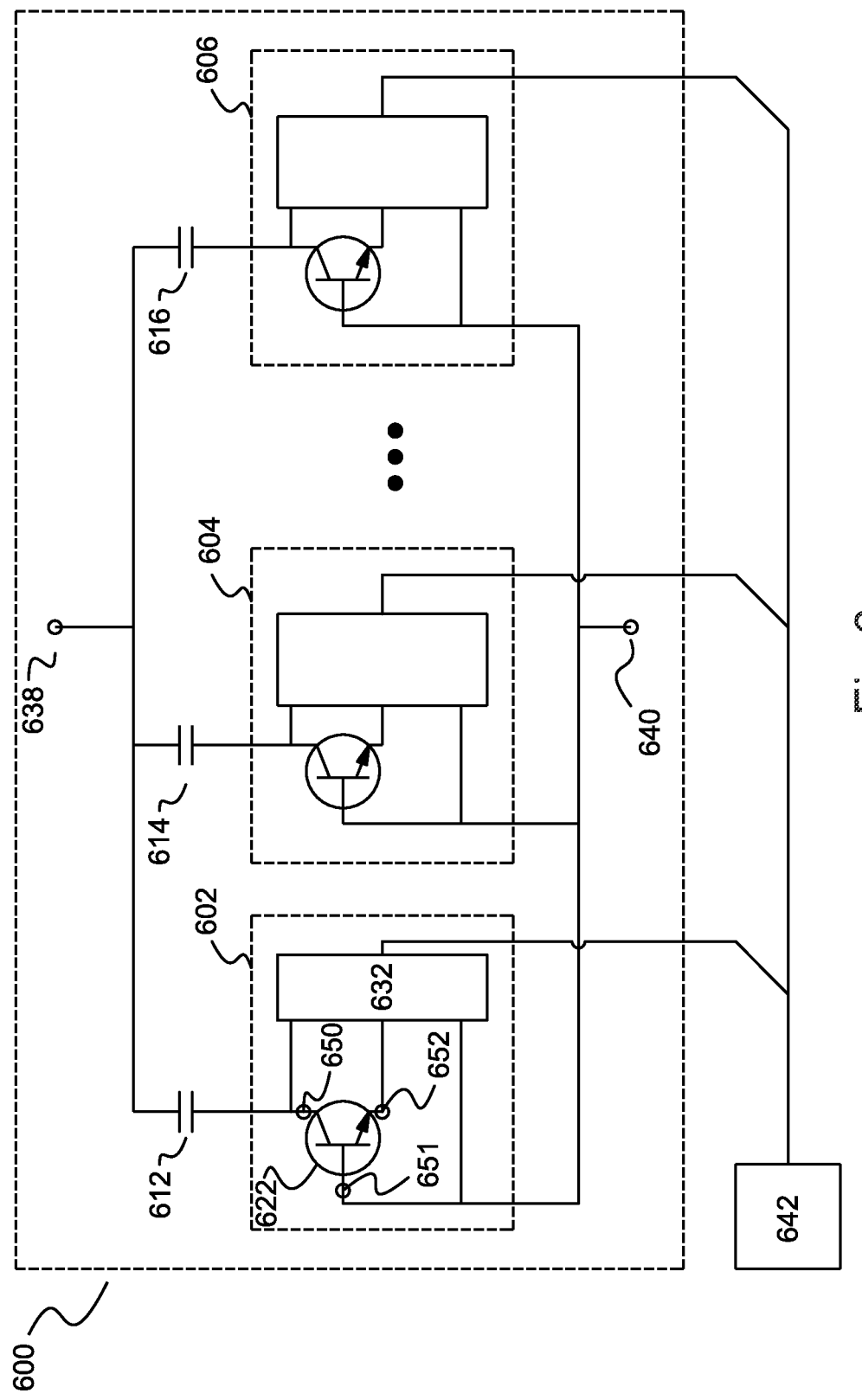
FIG. 6 illustrates an embodiment of a switched variable reactance element using a BJT as a switch.

FIG. 6 illustrates an embodiment of a switched variable reactance element 600, such as the switched variable reactance element 512 in FIG. 5. The switched variable reactance element 600 comprises one or more inductive or capacitive devices 612, 614, and 616 that are each selectively connected between first terminal 638 and second terminal 640 via a respective switch 602, 604, and 606. While capacitive devices 612, 614, 616 are illustrated, one skilled in the art will recognize that inductive devices or a combination of inductive and capacitive devices or indeed any circuit containing reactive or lossless components can be used. Reactance elements include, but are not limited to, capacitors, inductors, and coupled inductors. Lossless elements include, but are not limited to, transmission lines and transformers. The capacitive device 612 and switch 602 are connected in series as are the capacitive devices 614 and 616 and their respective switches 604 and 606. The combination of capacitive device 612 and switch 602 are connected in parallel to the combination of capacitive device 614 and the switch 604 and to the combination of capacitive device 616 and the switch 606. In alternative embodiments, all or some of the capacitive devices 612, 614 and 616 can be inductive, or comprise a combination of capacitive and inductive devices or indeed any circuit containing reactive or lossless components. The first and second terminals 638 and 640 may be terminals in the strict sense of the word, but more generally the reactive elements and switches may connect to distributed areas in the match network 104. The latter case is equivalent to using multiple single switch variable reactance elements and thus the description still applies. The terminal 640 can be a ground such as the match enclosure. Furthermore, more than one switch can be connected in parallel and put in series with a single reactive element to increase the current handling capability of the switch and reduce the number of power and control signals from controller 642.

The susceptance of the variable reactance element 600 increases as more of the capacitive devices 612, 614, 616 (e.g., capacitors) are connected between the first and second terminals 638 and 640. Susceptance would decrease if the capacitive devices 612, 614, 616 were inductive. Susceptance can increase or decrease if the capacitive devices 612, 614, 616 are replaced with a combination of capacitive and inductive devices. Although only three capacitive devices 612, 614, 616 and only three switches 602, 604, 606 are illustrated, one skilled in the art will recognize that any number of capacitive devices and switches can be implemented. In order to adjust the susceptance of the variable reactance element 600, the match network 104 can provide power and control signals via controller 642.

The greater the number of capacitive elements 612, 614, 616 the more precisely the match network 104 can adjust the impedance that the RF generator 102 sees. For instance, given a match 104 with a variable reactance element 600 with a capacitive range of 1200 pF to 6000 pF, the incremental capacitance adjustments can be smaller if there are more capacitive devices 612, 614, 616 in the variable reactance element 600. The same rule holds for other capacitive or inductive elements.

Figure 7:
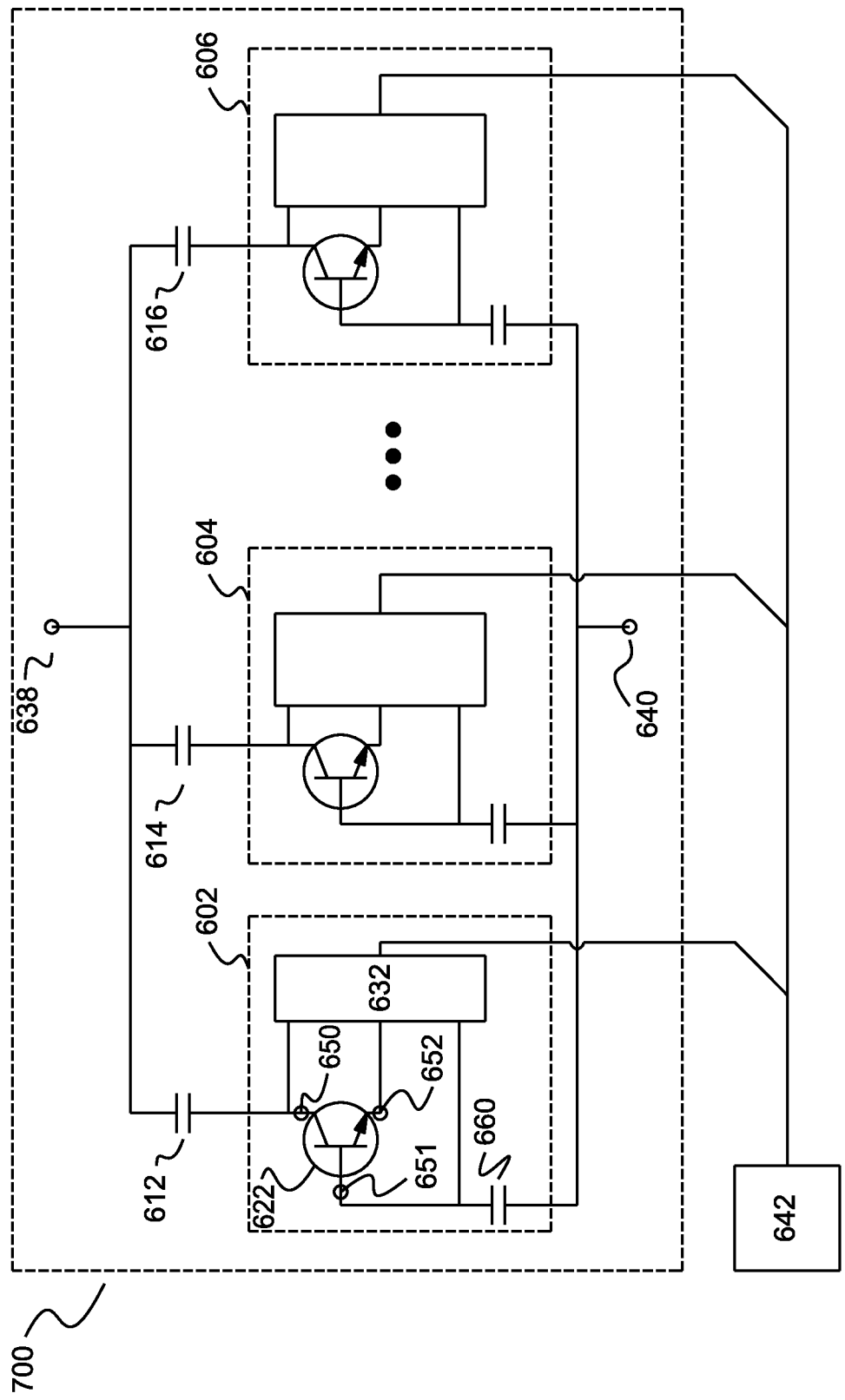
FIG. 7 illustrates another embodiment of a switched variable reactance element using a BJT as a switch.

FIG. 7 shows an alternative embodiment of the switch circuit 602 in which the base of the BJT 622 is not directly connected to the terminal 640, but capacitively connected through a capacitor 660. The capacitor 660 may be large (e.g., 100 nF for a 13.56 MHz application) in order to conduct the collector-base current to the terminal 640 with low losses.

In the illustrated embodiment, the switch 602 comprises an n-p-n bipolar junction transistor (BJT) 622 controlled via a biasing circuit 632. The BJT 622 has three terminals: a collector terminal 650, a base terminal 651, and an emitter terminal 652. The collector terminal 650 is connected to the collector and is a conductive interface between the collector and other components of the variable reactance element 600 or 700. The base terminal 651 is connected to the base and is a conductive interface between the base and other components of the variable reactance element 600 or 700. The emitter terminal 652 is connected to the emitter and is a conductive interface between the emitter and other components of the variable reactance element 600 or 700.

The BJT 622 has a base-collector current $I_{BC}$, a base-collector voltage $V_{BC}$, a base-emitter current $I_{BE}$, and a base-emitter voltage $V_{BE}$. Base-collector current $I_{BC}$ is positive when current flows from the base to the collector. Base-collector voltage $V_{BC}$ is positive when the potential at the base is higher than at the collector. Base-emitter current $I_{BE}$ is positive when current flows from the base to the emitter. Base-emitter voltage $V_{BE}$ is positive when the potential at the base is higher than at the emitter. $V_{BC}$, $I_{BC}$, $V_{BE}$, and $I_{BE}$ each represent the sum total of DC and AC signals. Here, as is common, the term AC means the alternating portion of current passing through a component, or equivalently, that which remains once the time-averaged value is subtracted. Similarly, the term DC means the time averaged value. AC and DC can thus refer to both voltage and current. In a typical match network the AC components of both voltage and current are sinusoidal or near-sinusoidal under steady state operation and the amplitude of the AC component of a voltage or current is simply the magnitude of the maximum deviation of the voltage or current from its time averaged value. All discussion of DC and AC components refer to the values once sinusoidal steady state is reached. If the generator output is pulsed, the time average needs to be taken over a sufficiently short time period while the RF signal is being applied, typically a few tens or a few hundred RF cycles. A collector current passing through the collector terminal 650 is a sum of all AC and DC currents passing through the collector terminal 650. The AC component of the collector current has a first amplitude. A base current passing through the base terminal 651 is a sum of all AC and DC currents passing through the base terminal 651. The AC component of the base current has a second amplitude. An emitter current passing through the emitter terminal 652 is a sum of all AC and DC currents passing through the emitter terminal 652. The AC component of the emitter current has a third amplitude. In an embodiment, only a small portion of the AC current passing through the BJT collector terminal 650 passes through the emitter terminal 652. With the BJT 622 biased to the on-state by the bias circuit 632, the second amplitude is greater than the third amplitude. In an embodiment, the third amplitude is negligible compared to the second amplitude.

The BJT 622 is biased via a biasing circuit 632. The biasing circuit 632 can apply one or more voltage or current sources or a combination of the two. In other words, BJT 622 can be controlled via voltage, current, or a combination of the two. The one or more voltage or current sources are configured to control $V_{BC}$, $V_{BE}$, $I_{BC}$, and $I_{BE}$.

The biasing circuit 632 can establish an on-state of the BJT 622 by forward biasing the base-emitter junction. The biasing circuit 632 can establish an off-state of the BJT 622 by reverse biasing the base-emitter junction and the base-collector junction.

In an embodiment, the biasing circuit 632 includes a base-emitter biasing circuit (not illustrated). The base-emitter biasing circuit generates either a positive or negative $V_{BE}$. In other words, the base-emitter biasing circuit controls whether the base-emitter junction is forward or reverse biased.

In an embodiment, the biasing circuitry 632 includes a base-collector biasing circuit (not illustrated). The base-collector biasing circuit generates a negative $V_{BC}$. In other words, the base-collector biasing circuit determines to what degree the base-collector junction is reverse biased.

The biasing circuit 632 is configured to control the state of the BJT 622. Although BJT's in general have multiple states including saturation, active-linear, and cutoff, in an embodiment, the BJT 622 is only operated in an 'on-state' and an 'off-state'. While the off-state is similar to the traditional cutoff mode for a BJT, the on-state is not known in the art.

In an embodiment, the biasing circuit 632 includes first, second, and third biasing devices (not illustrated). The first and second biasing devices are configured to bias the base-emitter junction. The first biasing device is configured to apply a negative or reverse bias to the base-emitter junction to establish the off-state of the BJT 622 (i.e., where the emitter terminal 652 has a higher potential than the base terminal 651). The second biasing device is configured to apply a positive or forward bias to the base-emitter junction to establish the on-state of the BJT 622 (i.e., where the base terminal 651 has a higher potential than the emitter terminal 652). The third biasing device is configured to apply a negative or reverse bias to the base-collector junction to establish the off-state of the BJT 622 (i.e., where the collector terminal 650 has a higher potential than the base terminal 651). The first and second biasing devices can be selectively coupled in series between the emitter terminal 652 and the base terminal 651 via a single pole double throw switch. The switch connects either the positive potential terminal of the first biasing device or the negative potential terminal of the second biasing device to the emitter terminal 652. The switch thus controls whether the BJT is in an on or off-state by selecting whether the base-emitter junction is forward or reverse biased.

In an embodiment, the first biasing device applies 12 V to the emitter 652 relative to the base terminal 651 such that the base-emitter junction is reverse biased. The second biasing device can apply −1.2 V to the emitter 652 relative to the base 651, having the opposite polarity to the first biasing device, through a 3.5Ω resistor such that the base-emitter junction is forward biased. The third biasing device can apply 700 V through a 2 MΩ resistor between the third biasing device and the collector in order to reverse bias the base-collector junction. With these values the BJT achieves an on-state resistance between base and collector of about 0.3Ω with an applied collector-base current of between 0 and 2 A RMS with a frequency of 13.56 MHz with a base-emitter current of about 0.1 A, the latter set by the −1.2 V, 3.5 ohm and the base-emitter voltage drop in the forward biased state. In the off-state this BJT configuration achieves a shunt resistance between base and collector of about 110 kΩ. In the off-state the reverse-biased base-collector junction can be modeled as a 10 pF capacitor in series with a 14Ω resistor. The parallel equivalent impedance is a 10 pF capacitor in parallel with a 100 kΩ resistor. The 110 kΩ shunt resistance was measured using a calorimetric measurement to determine junction losses when the base-collector junction was excited by a high voltage RF signal. The heat generated during this excitation was compared to the heat generated when a DC current was passed through the junction.

There is a current threshold for the collector-base current above which the BJT cannot be turned off, and thus cannot be controlled. This threshold for the configuration described above, is about 2 A RMS. It should be understood that these values are merely exemplary and that other combinations are also possible. For example the voltage of the first biasing device can be between 0 V and the base-emitter breakdown voltage. As another example, the second biasing device can be replaced with a current source to achieve better control of the base-emitter current or the third biasing device may use a smaller resistor to speed up the transition between off and on-states at the expense of higher dissipation in the resistor in the on-state where the 700 V bias voltage is dropped over the resistor. The 700 V bias voltage can be adjusted up and down, but in general should be chosen such that the collector terminal 650 is biased at a voltage larger than the amplitude of the collector terminal 650 voltage and the sum of the chosen bias voltage and the amplitude of the collector terminal 650 voltage is less than the collector-base breakdown voltage of the BJT 622.

Figure 8:
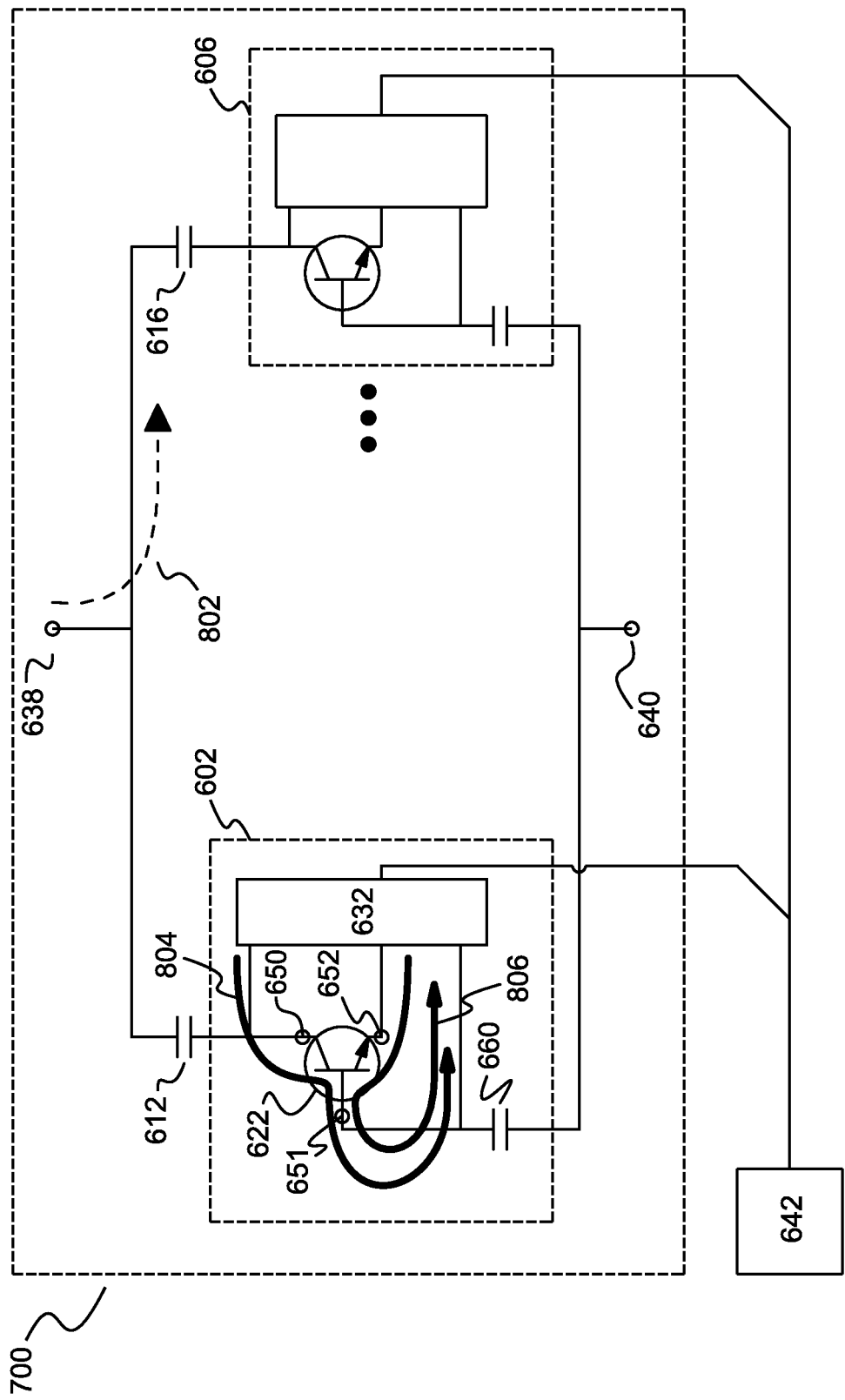
FIG. 8 illustrates an embodiment of a variable reactance element comprising a BJT switch in an off-state along with current paths through the variable reactance element.

FIG. 8 illustrates an embodiment of the variable reactance element of FIG. 7 comprising a BJT switch 622 in an off-state along with current paths 802, 804, 806 through a variable reactance element 700. Solid arrows represent DC currents. Dashed arrows represent AC currents.

A negative current or voltage bias is applied to the base-emitter junction such that $V_{BE}$ and $I_{BE}$ are negative. In other words, the emitter terminal 652 is at a higher potential than the base terminal 651. This reverse biases the base-emitter junction and prevents current from passing through the base-emitter junction. As such, the DC current 806 passing from the biasing circuit 632 through the emitter terminal 652 and base terminal 651 and back to the biasing circuit 632 is short lived and will only pass through the base-emitter junction during the short period that the base-emitter junction is being depleted of free carriers. There will also be a small emitter-base leakage current once the base-emitter junction is depleted of carriers.

A current 804 or voltage bias is applied to the base-collector junction such that $V_{BC}$ and $I_{BC}$ are negative. In other words, the collector terminal 650 is at a higher potential than the base terminal 651. This reverse biases the base-collector junction and prevents current 804 from passing through the base-collector junction. As such, the DC current 804 passing from the biasing circuit 632 through the collector terminal 650 and base terminal 651 and then back to the biasing circuit 632 is short lived and will only pass through the base-collector junction during the short period that the base-collector junction is being depleted of free carriers. Once the base-collector junction is depleted, the reverse bias current 804 from collector terminal 650 to base terminal 651 will cease, except for a small leakage current. Since both junctions are reverse biased, this off-state is similar to the cutoff-state in a traditional BJT.

With the BJT 622 biased such that both junctions are reverse biased the AC current 802 cannot pass through the reactive element 612 except for leakage current through the capacitance of the reverse biased base-collector junction. Thus, the AC current 802 continues on to the next capacitive device 616 and switch 606. If switch 606 is open/off, then the AC current 802 passes through another switch in the variable reactance element 700, or may not pass through the variable reactance element 700 at all if all switches 602, 606 are open/off. While both junctions of the BJT 622 are reverse biased, the capacitive device 612 is in series with the junction capacitance of the BJT 622 and thus contributes only a fraction (typically less than 10%) of the capacitance of the capacitive device 612 to the total capacitance of the variable reactance element 700.

Figure 9:
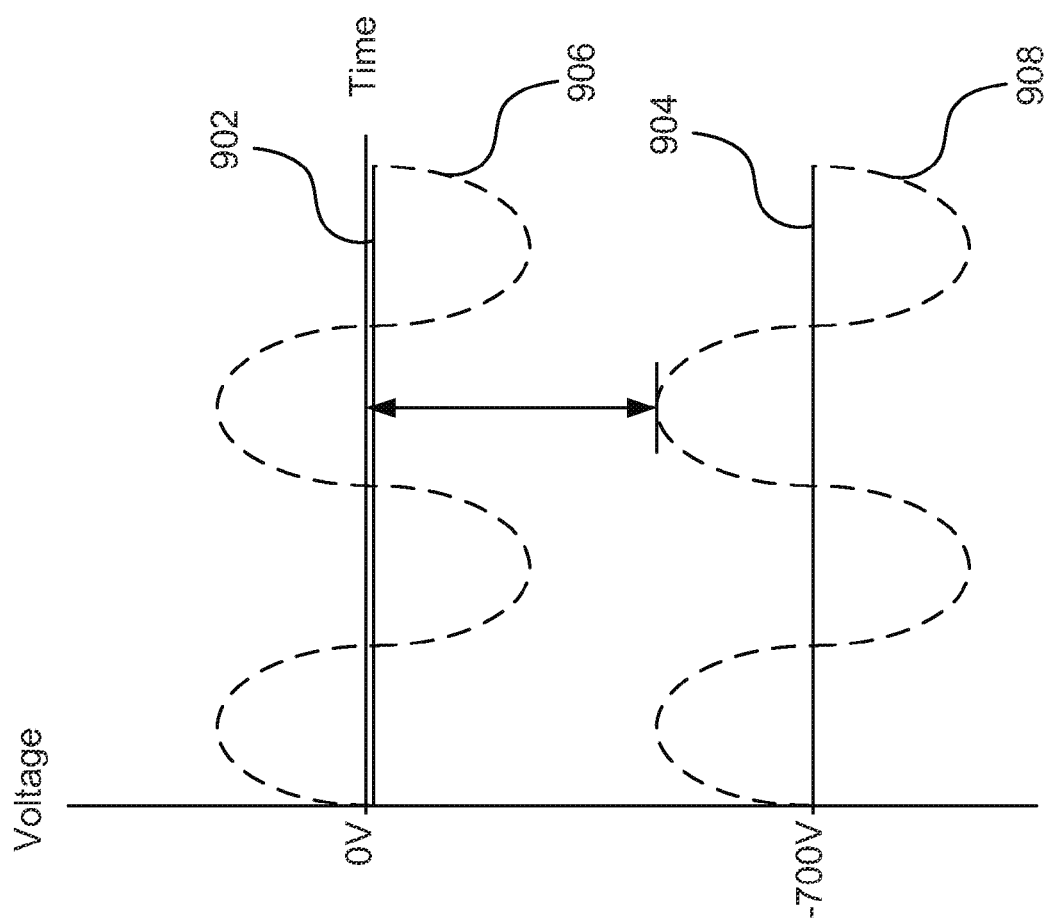
FIG. 9 illustrates one embodiment of bias voltages across the base-collector junction of a BJT switch, as herein disclosed off-state.

With reference to FIG. 9, if the reverse bias DC voltage 902 is negative (solid line), but has a magnitude less than the amplitude of the AC component of the collector-base voltage (dashed line), then the base-collector junction will be reverse biased during the negative AC cycle, but forward biased during the positive AC cycle (negative voltage means the base-collector junction is reverse biased). Thus, with only a small or negligible reverse bias on the base-collector junction, the base-collector junction will not remain turned off. That means the switch 602 will be partially uncontrollable.

The biasing circuit 632 should thus maintain a high enough magnitude of DC potential 904 on the base-collector junction that the base-collector voltage $V_{BC}$ is less than 0V when the collector base voltage is at its minimum. This is shown via the −700V DC bias 904 (solid line) and AC signal 908 (dashed line) centered around −700V. As seen, with such a bias, the sum of the DC 904 and AC 908 components is not capable of taking the net voltage positive and is thus not capable of forward biasing the junction when it is meant to be reverse biased. Since the DC bias 904 is large enough to prevent $V_{BC}$ from going positive, the base-collector junction remains reverse biased and the BJT 622 remains in the off-state. A magnitude of reverse bias voltage 904 substantially greater than the amplitude of the AC current 908 can therefore ensure that the BJT 622 does not get stuck in an on-state or a partially on-state.

Further advantages can be achieved by ensuring that the magnitude of $V_{BC}$ remains substantially greater than 0V. For instance, in the illustrated graph in FIG. 9 the DC bias 904 is −700V and the AC signal 908 has an amplitude of around 400V peak-to-peak. Thus, $V_{BC}$ never rises above −500V. This substantial reverse bias on the base-collector junction ensures that the junction is depleted of all or nearly all free carriers (ensuring low DC leakage current) and that the depletion region is wide (ensuring low AC leakage current since the wide junction acts as a low-capacitance capacitor).

Figure 10:
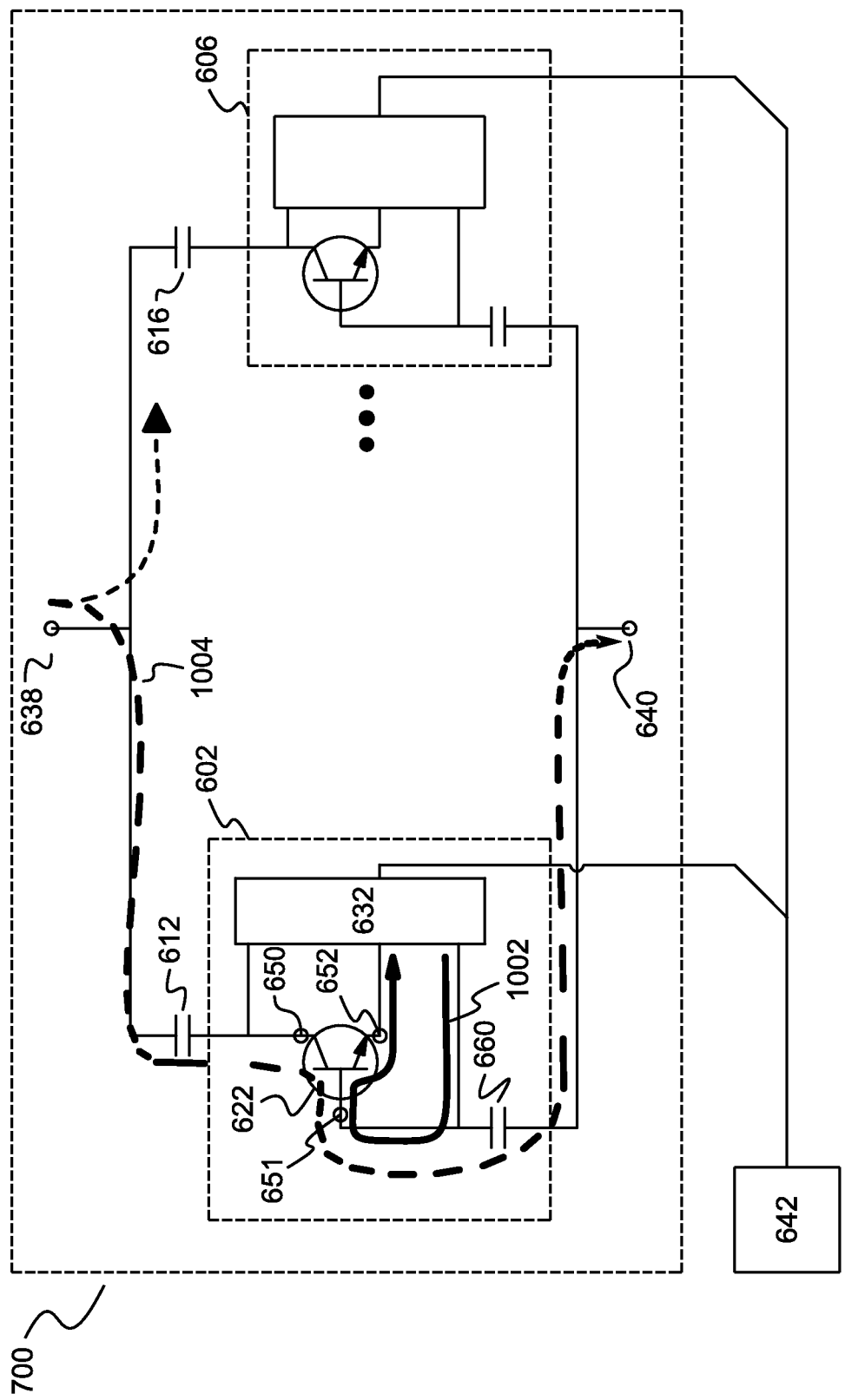
FIG. 10 illustrates an embodiment of a variable reactance element comprising a BJT switch in an on-state along with current paths through the variable reactance element.

FIG. 10 illustrates an embodiment of the variable reactance element of FIG. 7 comprising a BJT switch in an on-state along with current paths through the variable reactance element. Solid arrows represent DC currents. Dashed arrows represent AC currents. A positive current or voltage bias is applied to the base-emitter junction such that $V_{BE}$ and $I_{BE}$ are positive. In other words, the base terminal 651 is at a higher potential than the emitter terminal 652. This forward biases the base-emitter junction and allows DC current 1002 to pass through the base-emitter. Thus, the biasing circuit 632 passes DC current 1002 from the base terminal 651 to the emitter terminal 652. The DC base-emitter current 1002 can be a small fraction (e.g., no greater than 5%) of the AC current 1004 passing from the collector terminal 650 to the base terminal 651. This small DC current 1002 injects electrons into the base, which can then be swept into the base-collector junction to replenish those electrons that have recombined in the base-collector junction. In this way, the DC base-emitter current 1002 maintains the base-collector junction in a low-resistance state thus allowing the AC current 1004 to pass from the collector terminal 650 to the base terminal 651 with very low losses. In an embodiment, the forward bias $V_{BE}$ in the on-state is smaller than the reverse bias $V_{BE}$ in the off-state.

In the on-state the base-collector voltage is essentially zero and a small DC current (not illustrated) may flow from collector to base as a result of the biasing circuit 632, but this current has no effect on the operation of the BJT 622 in this state. As such, the base-collector voltage or bias is optional in the on-state.

Once the AC current 1004 passes through the capacitor 612, collector terminal 650, collector, base-collector junction, and base, it can choose to pass out the base terminal 651 and through the capacitor 660 en route to terminal 640 or continue through the base-emitter junction and exit via the emitter terminal 652 (assuming the biasing circuit 632 has a current path to terminal 640). The capacitor 660 presents a smaller impedance to the AC current 1004 than the path through the base-emitter junction. Thus, most of the AC current 1004 passes through the capacitor 660 and avoids the base-emitter junction. An empirical model of the BJT 622 further explaining why AC current 1004 prefers to avoid the base-emitter junction is presented in FIG. 12 and the related discussion below.

In the discussion of FIG. 10, the same components and functionality described with reference to switch 602 also apply to the one or more other switches 606.

Figure 12:
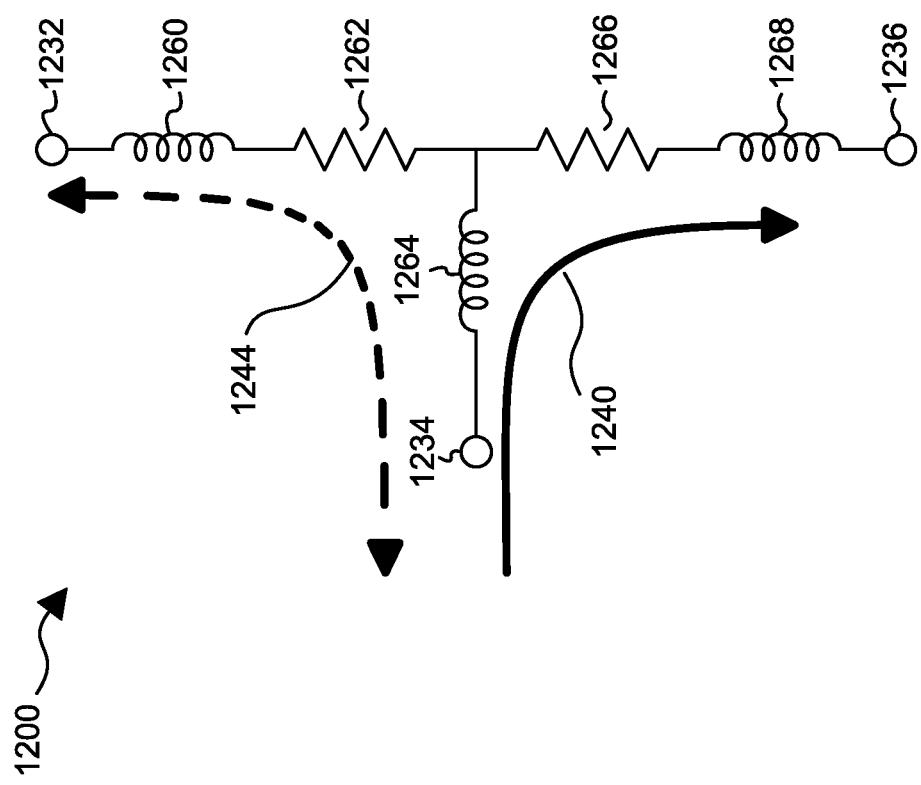
FIG. 12 illustrates an empirically-derived model of an n-p-n BJT operated in the on-state.

FIG. 12 illustrates an empirically-derived model of an n-p-n BJT operated in the on-state. The model 1200 predicts that AC current 1244 passing from the collector terminal 1232 to the base terminal 1234 will encounter a resistance 1262 ($R_1$). AC current passing from the collector terminal 1232 to the emitter terminal 1236 will encounter a resistance 1262 ($R_1$) and 1266 ($R_2$).

Traditionally an n-p-n BJT in saturation (the traditional 'on-state') is operated such that a current from base terminal to emitter terminal controls the on/off-state of the BJT by allowing or preventing current from passing from the collector terminal to the emitter terminal. In contrast, in this disclosure a current from the base terminal 1234 to the emitter terminal 1236 controls the on/off-state of the BJT 1200 by allowing or preventing current from passing from the collector terminal 1232 to the base terminal 1234. Additionally, the losses associated with passing an AC current between the collector terminal 1232 and the emitter terminal 1236 can be substantially reduced by passing the AC current between the collector terminal 1232 and the base terminal 1234. For AC current passing from the collector terminal 1232 to the emitter terminal 1236 there are losses due to both resistances 1262 ($R_1$) and 1266 ($R_2$). For AC current 1244 passing from the collector terminal 1232 to the base terminal 1234, there are only losses due to resistance 1262 ($R_1$). Thus, losses can be significantly reduced by passing AC current 1244 from the collector terminal 1232 to the base terminal 1234.

Referring again to the embodiment of FIG. 7, there is a preferred capacitance for the capacitor 660 that will minimize losses to the AC current 1244 via use of a low-impedance capacitor 660. This is especially true in configurations where the emitter 652 is directly connected to the second terminal 640, and the capacitor 660 thus effectively connects the base terminal 651 to the emitter terminal 652. In this case what would normally be considered an effective bypass capacitance can, in conjunction with the parasitic lead inductances 1264 and 1268 (see FIG. 12), create a resonant circuit that can increase losses dramatically. To avoid this and ensure that the current 1244 preferentially flows from the collector terminal 1232 to the base terminal 1234, the capacitor 660 can be large, for instance with a value of about 100 nF, for operation at 13.56 MHz.

FIG. 13 illustrates a cross section of an n-p-n BJT operated in the off-state described in this disclosure. In the off-state both a base-collector junction 1330 and a base-emitter junction 1332 are reverse biased. Therefore, both depletion regions (not drawn to scale) are wider than they are when not biased or when forward biased (compare to the depletion region widths in FIG. 14, also not drawn to scale). The large depletion regions in the off-state prevent both DC current 1322 and AC current 1320 from passing through the junctions 1330, 1332. The depletion regions are substantially devoid of free carriers and thus are not conductive for DC current 1322. The depletion regions can be modeled as low capacitance capacitors (wide gap between two conductors formed from free carriers in the doped regions) and thus present high impedance to the AC current 1320.

FIG. 14 illustrates a cross section of an n-p-n BJT operated in the on-state. In the on-state the base-collector junction 1430 is substantially non-biased (a reverse bias may be applied, but compared to the AC current 1420, the reverse DC bias has a negligible effect on the junction 1430). From an AC perspective, the prior art teaches that the junction 1430 should rectify the AC current 1420. However, the carrier lifetimes within the base-collector depletion region are long enough that the alternating polarity of voltage across the junction 1430 does not deplete the depletion region of carriers during the half cycles when the junction 1430 is reverse biased. Thus, there is no rectification and the AC current 1420 passes between the collector terminal 1402 and the base terminal 1404 with low losses.

The base-emitter junction 1432 is forward biased in the on-state with a DC current 1422 and has a smaller depletion region than it would have if reverse biased or if there were no bias.

In an embodiment, a collector current passing through the collector terminal 1402 has an AC component having a first amplitude. Collector current is that current passing through the collector terminal 1402 and is the sum of AC and DC components. A base current passes through the base terminal 1404 and has an AC component having a second amplitude. Base current is that current passing through the base terminal 1404 and is the sum of AC and DC components. An emitter current passes through the emitter terminal 1406 and has an AC component having a third amplitude. Emitter current is that current passing through the emitter terminal 1406 and is the sum of AC and DC components. The second amplitude can be greater than the third amplitude. The second amplitude can be greater than the magnitude of the DC component of the base current. The second amplitude can be at least five times greater than the third amplitude. The second amplitude can be at least five times greater than the magnitude of the DC component of the base current.

In an embodiment of the off-state (FIG. 13), a breakdown voltage between the collector terminal 1302 and the base terminal 1304 is at least 1000 V when the base and emitter terminals 1304, 1306 are at an equivalent potential, for instance ground.

Figure 15:
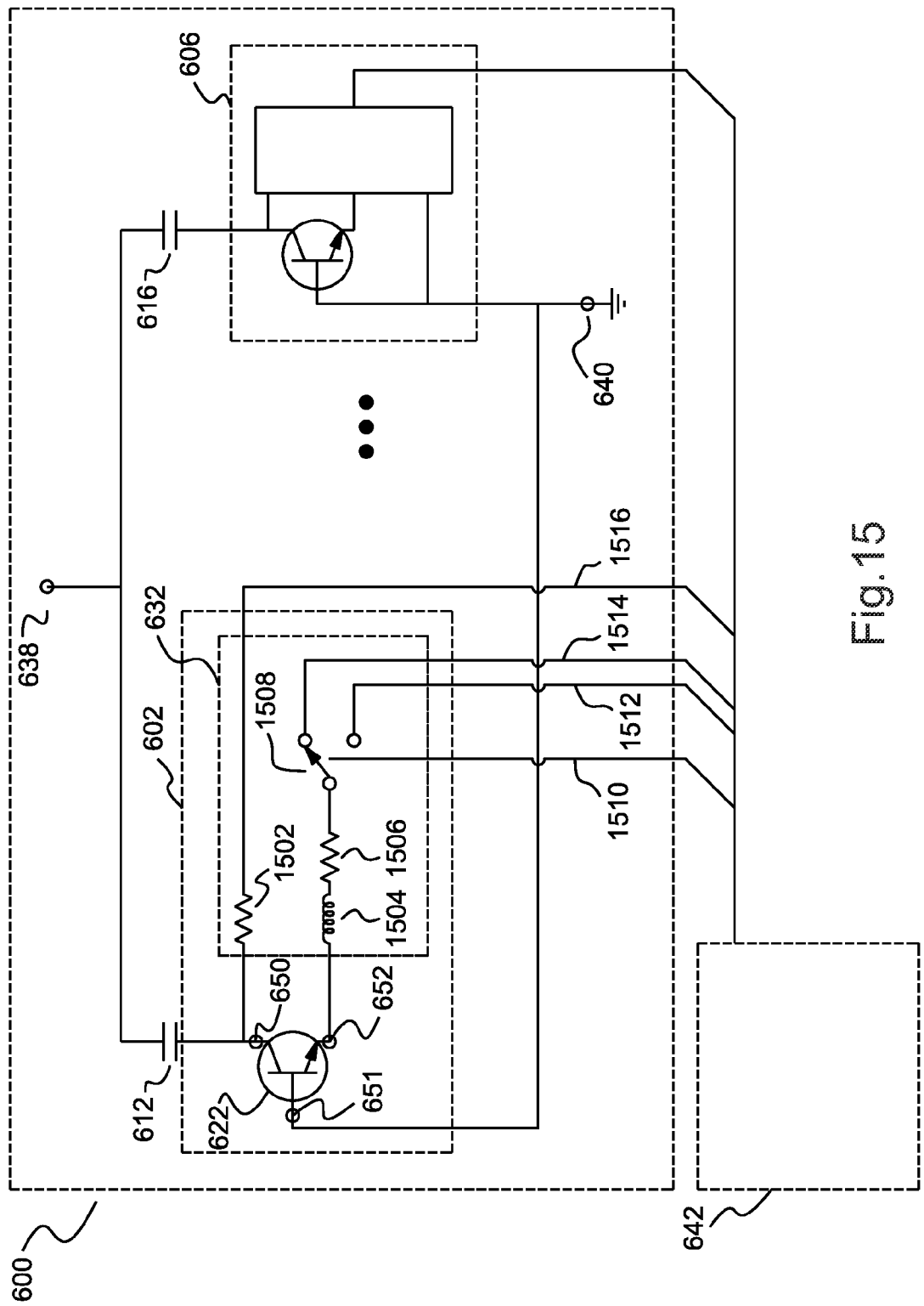
FIG. 15 illustrates an embodiment of an n-p-n BJT that acts as a switch in a variable reactance element.

FIG. 15 illustrates an embodiment of biasing circuit 632. The switch 1508 selects whether the BJT 622 is in an on or off-state by selecting whether the base-emitter junction is forward or reverse biased. The switch 1508 can be implemented with two MOSFET devices but many other possibilities exist. The signal line 1510 controls the state of the switch 1508.

In an embodiment, the switch 1508 is connected to a 12 V supply line 1512 and to a −1.2 V supply line 1514. When the switch is connected to the 12 V supply line 1512 the base-emitter junction is reverse biased through a 330 nH inductor 1504 and a 3.5Ω resistor 1506. When the switch 1508 is connected to the −1.2 V supply line 1514 the base-emitter junction is forward biased through the 330 nH inductor 1504 and the 3.5Ω resistor 1506. The collector terminal 650 is connected to a third 700 V biasing supply line 1516 through a 2MΩ resistor 1502. With these values the BJT 622 can achieve an on-state resistance of about 0.3Ω with a base-emitter current of about 0.1 A. In the off-state this configuration achieves a shunt resistance of about 110 kΩ. There is a current threshold, above which the BJT 622 cannot be turned off, and thus cannot be controlled. This threshold for the embodiment illustrated in FIG. 15 is about 3 A RMS. It should be understood that these values are merely exemplary and that other combinations are also possible.

Unlike the embodiment illustrated in FIG. 7, here the base terminal 651 is connected to ground 640. When the BJT 622 is in the on-state the AC current passes through the collector terminal 650, through the collector, to the base, out the base terminal 651, and to ground 640. Thus, this embodiment typically has even lower losses than the embodiment in FIG. 7 since the AC current does not have to pass through a capacitor en route to ground 640.

One challenge associated with the novel use of a BJT as herein disclosed, is that the voltage drop across a switch in a classic match network is more than a BJT may be able to handle. A novel match network topology can therefore be implemented in order to reduce the voltage drop across the BJT.

Figure 16:
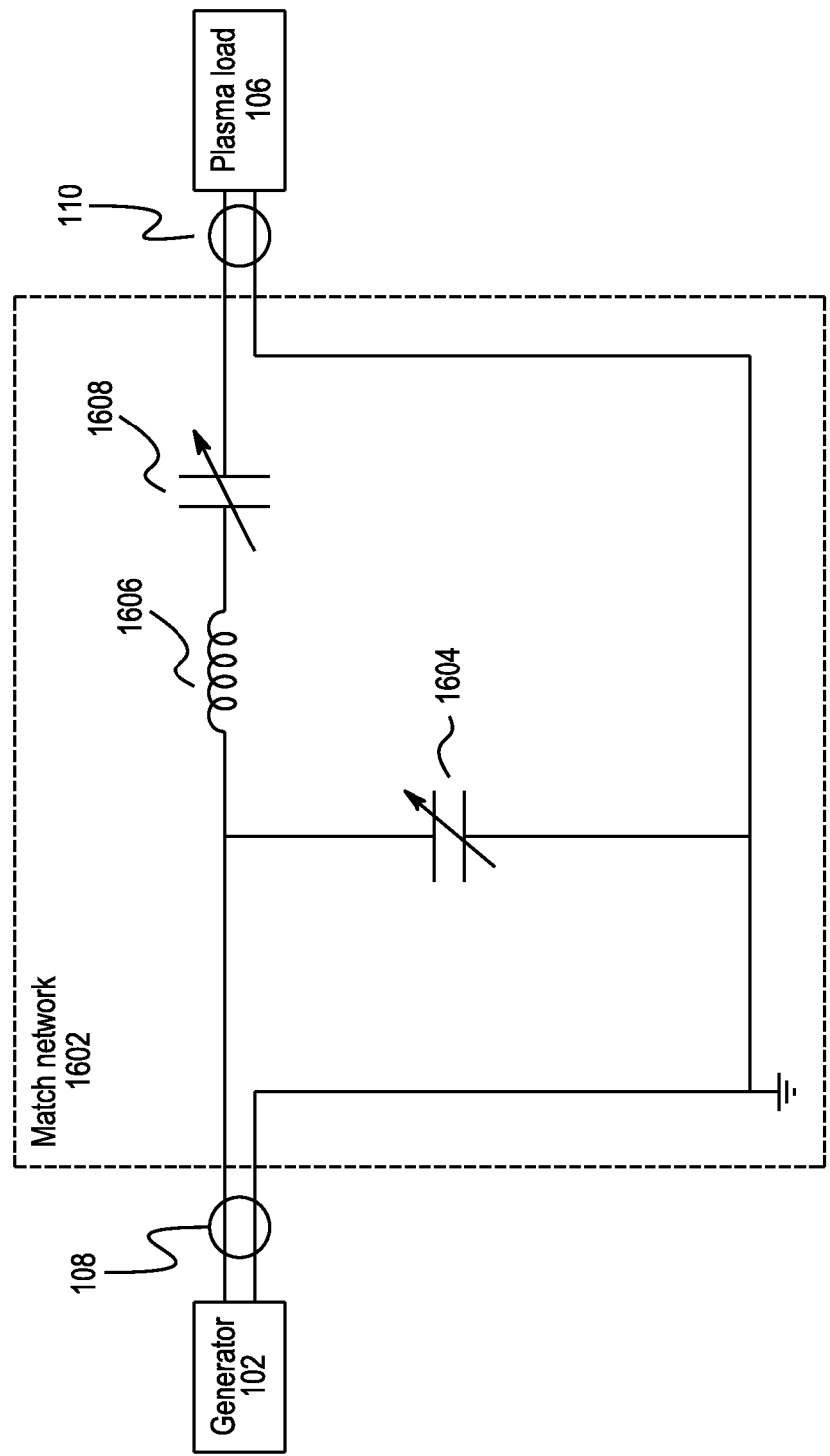
FIG. 16 illustrates a match network as known in the art.

FIG. 16 illustrates a match network as known in the art. The classic L-match network 1602 comprises a variable shunt reactance element 1604 and a variable series reactance element comprising the series connected fixed reactance element 1606 and variable capacitor 1608. Between the variable shunt reactance element 1604 and the variable series reactance element is an input to the classic L-match network 1602. Between the variable series reactance element and the plasma load 106 is an output of the classic L-match network 1602. However, in many applications the voltage drop over the variable series reactance element is higher than what can be handled by a switched variable reactance element using the BJT switches herein disclosed. Thus, this topology may not be compatible with the novel use of a BJT as herein disclosed.

Figure 11:
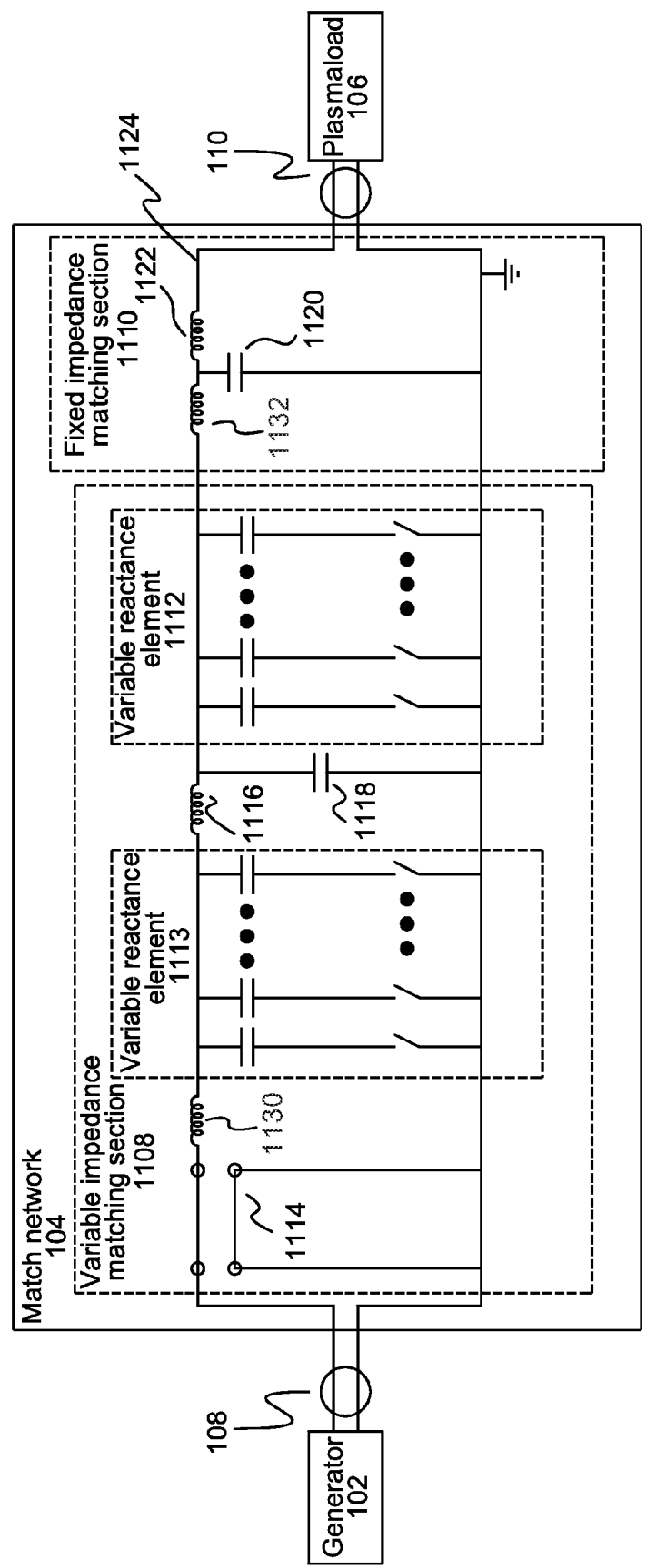
FIG. 11 illustrates an embodiment of a match network including a fixed-impedance-matching section connected between a variable impedance-matching section and a plasma load.

FIG. 11 illustrates an embodiment of a match network including a fixed impedance-matching section 1110 connected between a variable impedance-matching section 1108 and the plasma load 106. The variable impedance-matching section 1108 can include at least one variable reactance element 1112. The at least one variable reactance element 1112 can be arranged with any number of fixed reactance elements such as fixed inductor 1116, optional fixed inductor 1130, transmission line 108, and fixed capacitor 1118. The at least one variable reactance element 1112 can also be arranged with any number of fixed lumped and distributed elements and circuits. The illustrated variable impedance-matching section 1108 includes two variable reactance elements 1112, 1113. The fixed impedance-matching section 1110 is illustrated as being in cascade with variable reactance elements 1112, 1113. The fixed impedance-matching section 1110 is also illustrated as being in cascade with the plasma load 106. In an embodiment, the fixed impedance-matching section 1110 can merely be configured to be in cascade with the plasma load 106, since the match network 104 is typically a separate apparatus from the plasma load 106.

The fixed impedance-matching section 1110 can include at least two reactive components in a ladder network configuration (or a series-shunt network). One of these two reactive components can include a shunt element 1120, although this reactive component can also include more than one shunt element 1120. The shunt element 1120 is illustrated as a capacitor, but can be any reactive and/or lossless elements (e.g., inductors, coupled inductors capacitors, transmission lines, transformers, to name a few). The other reactive component can include a series element 1122, illustrated as an inductor in series with a high voltage path 1124. In other embodiments, more than one reactive and/or lossless element can be connected in series with the high voltage path 1124 to form the series element 1122. The inductive element 1122 can be a discrete device or can merely be representative of the inductance of the high voltage path 1124.

Although the shunt element 1120 is part of a "fixed" impedance-matching section 1110, one skilled in the art will recognize that the shunt element 1120 can include capacitive or inductive devices having a small variable capacitance (e.g., 1%). The at least two reactive components of the fixed impedance-matching section 1110 can operate as a one-port or multi-port network. The fixed impedance-matching section 1110 can also include one or more optional reactive components such as optional inductor 1132.

The fixed impedance-matching section 1110 reduces the peak voltage across the variable reactance element 1112 by a factor of two or more compared to the peak voltage across a classic variable series reactance element (e.g., the series combination of 1606 and 1608 in FIG. 16). Such a voltage reduction can be measured when both the fixed impedance-matching section 1110 and the classic variable series reactance element see the same range of load impedances, produce the same input impedance, and are both configured to deliver equivalent power to the plasma load 106. An example of a classic variable series reactance element is illustrated in FIG. 16 and comprises a combination of the series connected fixed reactance element 1606 and the variable capacitor 1608.

The variable reactance elements 1112 and 1113 in the illustrated embodiment are ground referenced and constructed as detailed in FIG. 6, FIG. 7 or FIG. 15 or as described herein. The inductor 1116 and optional inductor 1130 may be discrete inductors or transmission line structures with sufficiently high characteristic impedance. Although the variable reactance elements 1112, 1113 are illustrated as ground referenced, they can also be floating.

In an embodiment, the fixed impedance-matching section 1110 has a structure, including at least two fixed-value reactive components, such that the at least two fixed-value reactive components cannot be reduced to a single reactance for the purpose of determining how an arbitrary load impedance is transformed to the input impedance of the fixed impedance-matching section 1110. In other words, the fixed impedance-matching section 1110 cannot be modeled by a simplified equivalent circuit comprising only one reactive element.

In an embodiment, a first set of reactive devices such as 612 in FIG. 6 or FIG. 7 in series with the switches such as 602 in FIG. 6 or FIG. 7 internal to variable reactance element 1112 or 1113 have identical reactance, and a second set of reactive devices have different reactance. For instance, a first set of reactive devices may have capacitance equal to 50 pF while a second set of reactive devices may have capacitances equal to 25, 12, 6 and 3 pF. In this example and similar embodiments, the first set of reactive devices can be used to make large-increment changes to the match network and the second set of reactive devices to make small-increment changes to the match network.

In an embodiment, at least ten of the reactive devices have identical capacitance. Other reactive devices can have one or more other reactance values. In an embodiment, at least twenty of the reactive devices have identical reactance. In an embodiment, at least thirty of the reactive devices have identical reactance. In an embodiment, at least fifty of the reactive devices have identical reactance.

Figure 19:
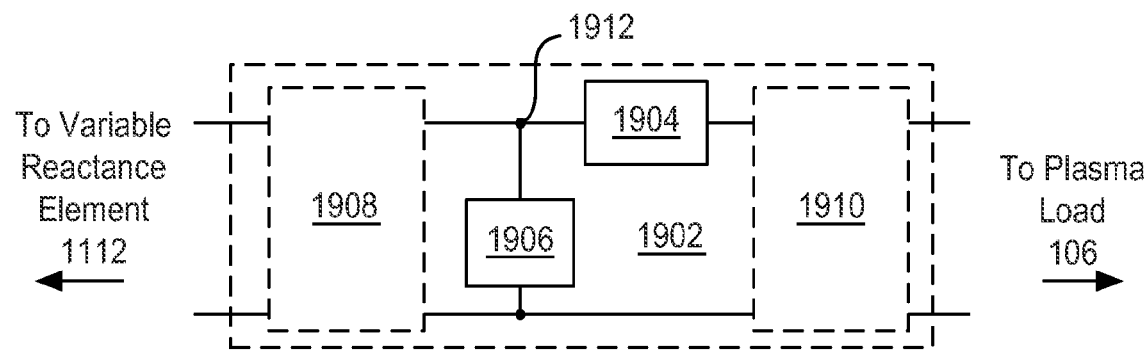
FIGS. 19-20 illustrate two embodiments of a fixed impedance-matching section.

FIG. 19 illustrate an embodiment of a fixed impedance-matching section. The fixed impedance-matching section 1902 can include two reactive components 1904, 1906. The first reactive component 1904 can be a series element. The second reactive component 1906 can be a shunt component. The first and second reactive components 1904, 1906 can each comprise one or more reactive and/or lossless elements. In the illustrated embodiment, the first and second reactive components 1904, 1906 are configured such that the series element 1904 is closest to the plasma load 106. By closest to the plasma load 106 it is meant that a network consisting of the generator 102, transmission line 108, match network 104, electrical connection 110 and plasma load 106 can be organized into a first and second sub-network. The first sub-network can include the shunt element 1906 and the generator 102, and the second sub-network can include the series element 1904 and the load 106. In such a configuration, the series element 1904 is closest to the plasma load 106.

In an embodiment, the fixed impedance-matching section 1902 can also include optional additional reactive components 1908, 1910. The optional additional reactive components 1908, 1910 can include any number, combination, and arrangement of reactive and/or lossless elements.

Figure 20:
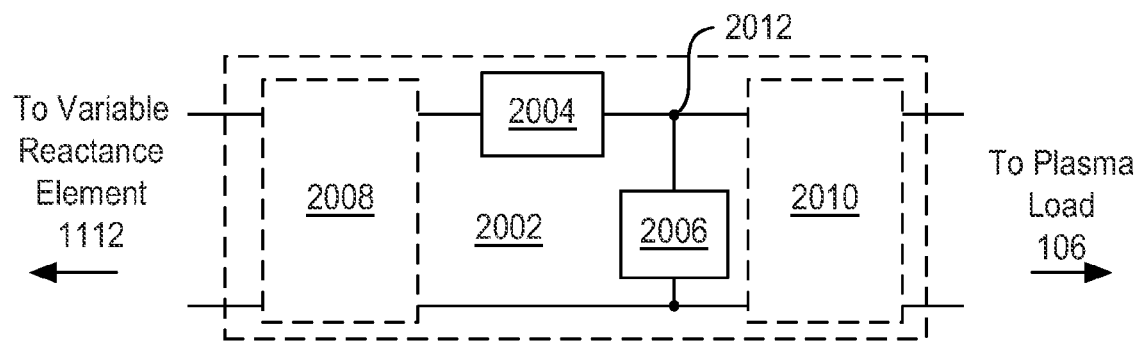

FIG. 20 illustrates another embodiment of a fixed impedance-matching section. The fixed impedance-matching section 2002 can include two reactive components 2004, 2006. The first reactive component 2004 can be a series element. The second reactive component 2006 can be a shunt component. The first and second reactive components 2004, 2006 can each comprise one or more reactive and/or lossless elements. In the illustrated embodiment, the first and second reactive components 2004, 2006 are configured such that the shunt element 2006 is closest to the plasma load 106. By closest to the plasma load 106 it is meant that a network consisting of the generator 102, transmission line 108, match network 104, electrical connection 110 and plasma load 106 can be organized into a first and second sub-network. The first sub-network can include the series element 2004 and the generator 102, and the second sub-network can include the shunt element 2006 and the load 106. In such a configuration, the shunt element 2006 is closest to the plasma load 106.

In an embodiment, the fixed impedance-matching section 2002 can also include optional additional reactive components 2008, 2010. The optional additional reactive components 2008, 2010 can include any number, combination, and arrangement of reactive and/or lossless elements.

Figure 21:
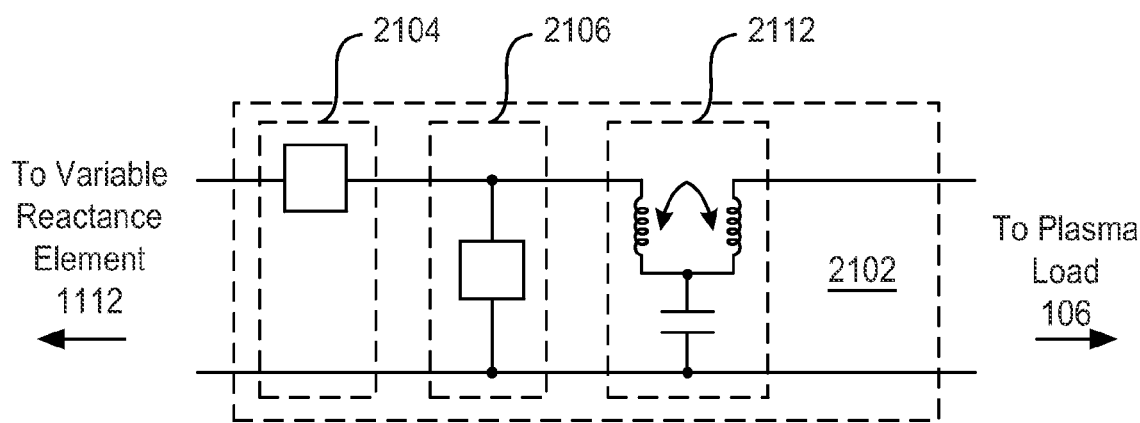
FIG. 21 illustrates another embodiment of a fixed impedance-matching section.
Figure 22A:
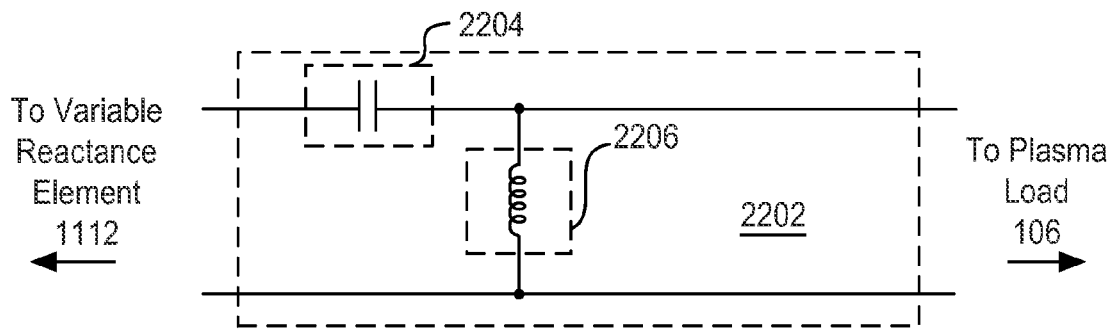
FIGS. 22A, 22B, 22C, and 22D illustrate four additional non-limiting embodiments of the fixed impedance-matching section.
Figure 22B:
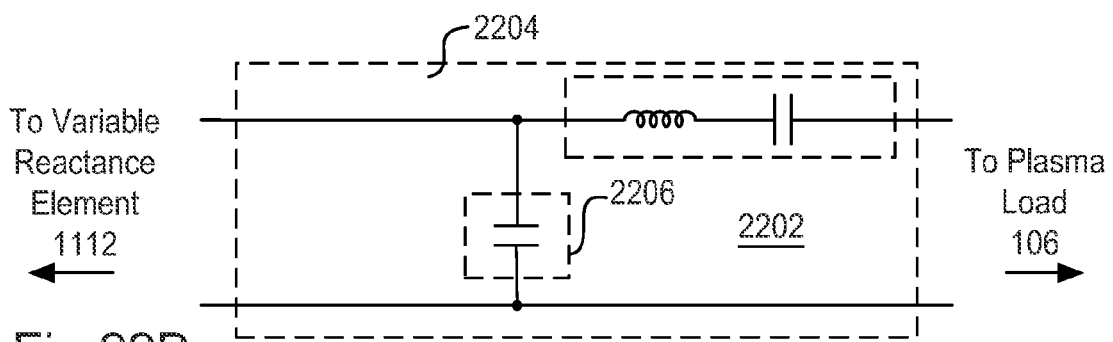
Figure 22C:
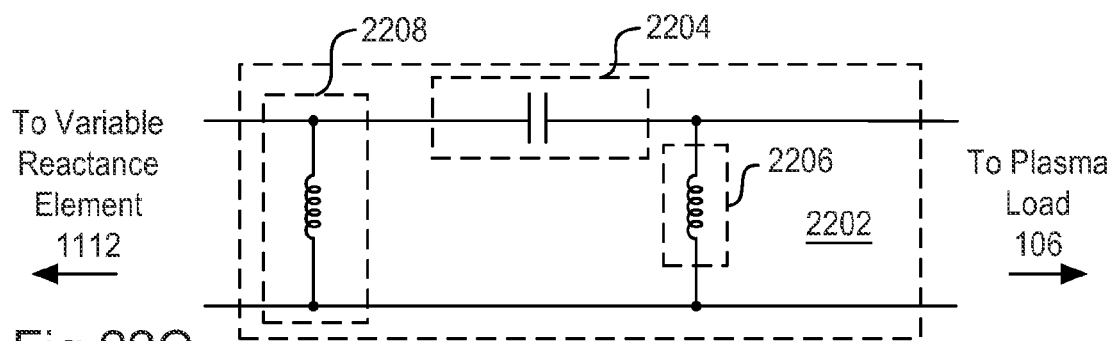
Figure 22D:
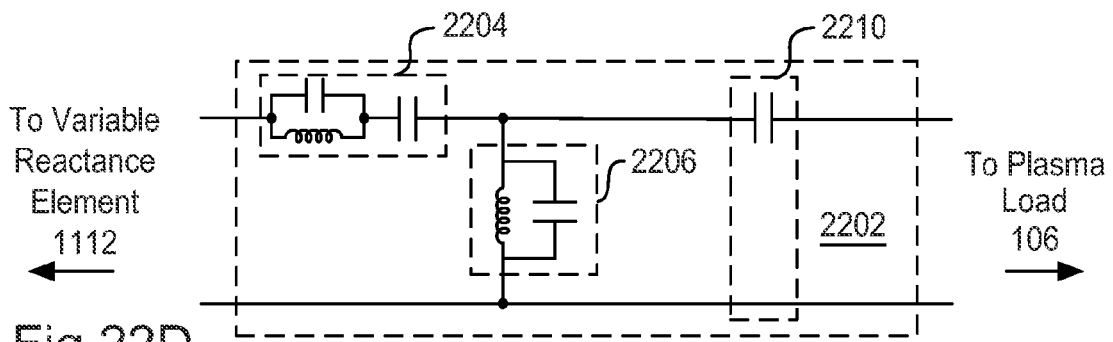

FIG. 21 illustrates another embodiment of a fixed impedance-matching section. The fixed impedance-matching section 2102 can include a cascade of two or more distinct Darlington sections 2104, 2106, 2112 as characterized in S. Darlington, "Synthesis of Reactance 4-Poles Which Produce Prescribed Insertion Loss Characteristics", J. Math Phys., September 1939, pp. 257-353 or one Darlington section and one transformer. The series element 1904 or 2004 corresponds to an A-type Darlington section 2104 and the shunt element 1906 or 2006 corresponds to a B-type Darlington section 2106. A C-type Darlington section 2112, as is well known in the art, can include a capacitor and a coupled pair of inductors arranged as illustrated. One of the two Darlington sections 2104, 2106 may be replaced by a transformer.

All three fixed impedance-matching sections 1902, 2002, 2102 of FIGS. 19-21 can be arranged in cascade between the variable reactance element 1112 and the plasma load 106.

FIGS. 22A, 22B, 22C, and 22D illustrate four additional non-limiting embodiments of the fixed impedance-matching section. Although these are just some of the many arrangements of a fixed impedance-matching section 2202, each comprises a first series reactive component 2204 comprising one or more reactive or lossless elements, and a second shunt reactive component 2206 comprising one or more reactive or lossless elements. The series and shunt components 2204, 2206 comprise any combination and arrangement of reactive and/or lossless elements. In some embodiments, optional reactive components 2208, 2210 can also be used. The optional reactive components 2208, 2210 can include any number, combination, and arrangement of reactive and/or lossless elements.

While BJT's are effectively implemented in the novel switching configuration described above, they are limited in the amplitude of AC current that they can handle. If the AC amplitude is too great, then the BJT can get stuck in a perpetual on-state. Insulated-gate bipolar transistors (IGBT's) on the other hand, can be operated in a similar novel fashion to the BJT's described above, but can handle larger AC currents before getting stuck in an on-state.

Figure 17:
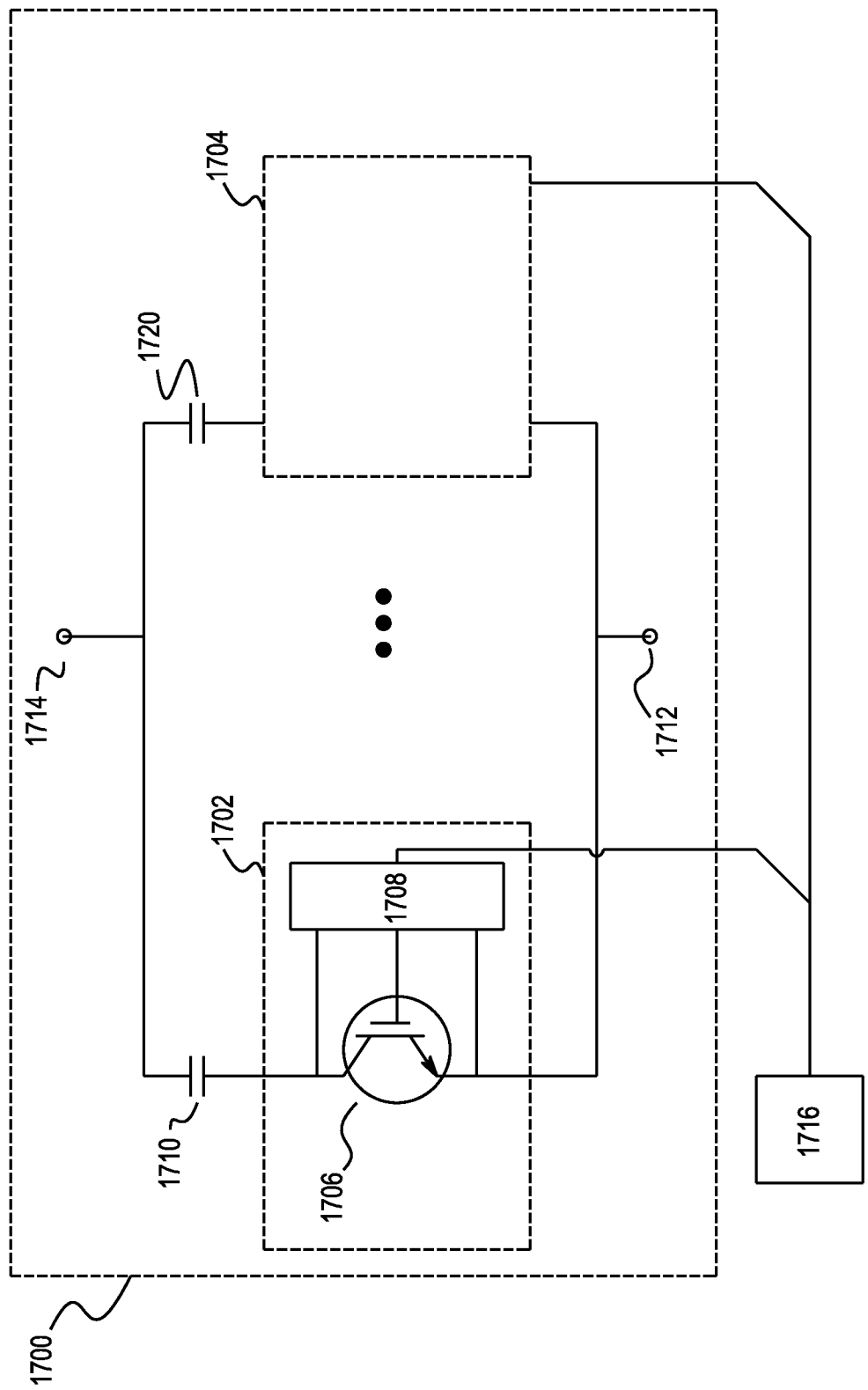
FIG. 17 illustrates an embodiment of a match network using an IGBT rather than a BJT to switch a reactive element in and out of a variable reactance element.

FIG. 17 illustrates an embodiment of a match network using an IGBT rather than a BJT to switch a reactive element in and out of a variable reactance element. The illustrated embodiment includes two reactive elements 1710, 1720. The reactive elements 1710, 1720 are illustrated as capacitive devices (e.g., capacitors), but can include any reactive and/or lossless devices (e.g., any capacitive or inductive devices, or a combination of capacitive and inductive devices). Each of the reactive elements 1710, 1720 are connected to a first terminal 1714 and selectively coupled to a second terminal 1712. When coupled to the second terminal 1712, the reactive elements 1710, 1720 add to the total reactance between the first and second terminals 1714 and 1712. Switches 1702, 1704 control connection between the reactive elements 1710, 1720 and the second terminal 1712.

Each switch 1702, 1704 includes an IGBT 1706 and a biasing circuit 1708. The IGBT 1706 includes a BJT operated in related fashion to the BJT embodiments described earlier in this disclosure. The IGBT 1706 has a collector, emitter, and gate. The reactive element 1710 is connected to the collector. The second terminal 1712 is connected to the emitter. The biasing circuit 1708 is connected to the gate, emitter, and collector. When the IGBT 1706 is in an on-state, current from a terminal 1714 passes through the reactive device 1710 and through the IGBT 1706 collector to the IGBT emitter and then to the second terminal 1712.

The biasing circuit 1708 is configured to apply a positive voltage from collector to emitter in the off-state of the switch 1702. This can be accomplished via a voltage source in series with a resistor, for instance. The biasing circuit 1708 is also configured to apply a voltage between the gate and emitter. A positive voltage above an IGBT 1706 threshold voltage causes the IGBT 1706 to be in an on-state and consequently short the reactive element 1710 to the second terminal 1712.

The downside of using an IGBT instead of a BJT is that there can be greater losses. AC current passes through a BJT embedded in an IGBT. The AC passes from the collector to the emitter in this embedded BJT rather than from collector to base as in the BJT embodiments described earlier. As such, the AC can see losses from both junctions in the embedded BJT and thus an IGBT may incur greater losses than a BJT used as herein disclosed.

Figure 18:
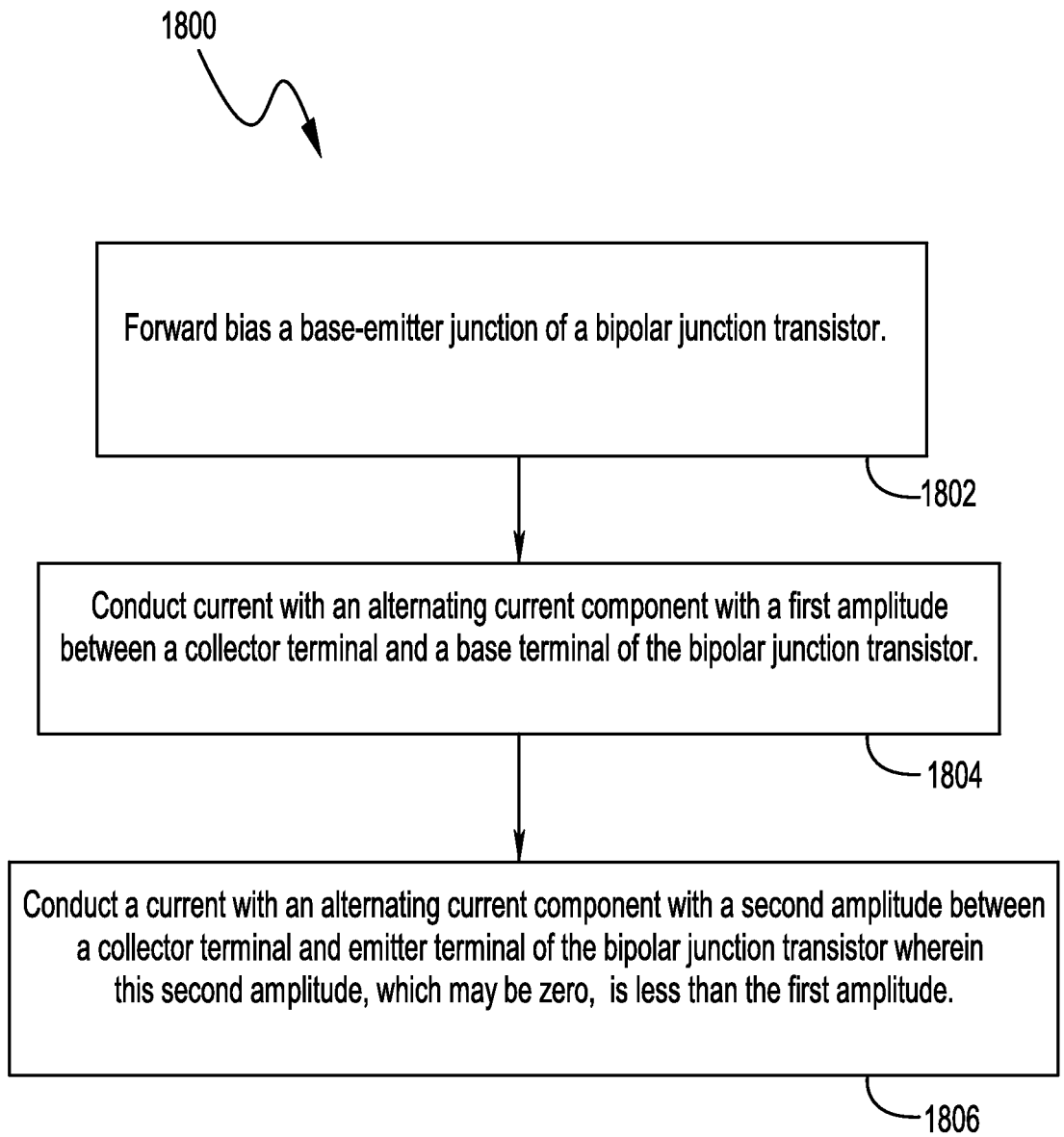
FIG. 18 illustrates a method of operating a BJT where AC current passes primarily between collector and base rather than between collector and emitter.

FIG. 18 illustrates a method of operating a BJT where AC current passes primarily between a collector terminal and a base terminal rather than a collector terminal and an emitter terminal. The method 1800 includes a forward bias a base-emitter junction of a BJT operation 1802. The method 1800 further includes a conduct current with an alternating current component with a first amplitude between a collector terminal and a base terminal of the BJT operation 1804. The method 1800 further includes a conduct a current with an alternating current component with a second amplitude between a collector terminal and an emitter terminal of the bipolar junction transistor wherein this second amplitude, which may be zero, is less than the first amplitude operation 1806.

What differentiates this method from the traditional use of a BJT is that here the first amplitude is greater than the second amplitude (an AC component of current in the base terminal is greater than an AC component of current in the emitter terminal). In other words, alternating current passes primarily from collector to base and out a base terminal rather than from collector to base to emitter and out an emitter terminal. This unique operation can in part be made possible by creating a low impedance path external to the BJT for current passing from collector to base either by directly connecting the base terminal of the BJT to the second terminal of the variable reactance element in which the BJT is used as a switch, or by providing a low impedance between the base terminal and the second terminal with a high-value capacitor. Performance can be improved further by providing a high impedance to alternating current flowing through the BJT emitter from collector to emitter.

All of the results cited were obtained with silicon devices. However, devices manufactured using GaAs, GaN, SiC or any of the other known semiconductor materials can also be used. In addition GaN HEMT devices may also be used in place of bipolar devices and make effective RF switches.

In conclusion, the present invention provides, among other things, a method, system, and apparatus that enables the use of bipolar devices as highly effective switches in impedance-matching networks. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A match network comprising:
one or more variable reactance elements each having a first and a second terminal and each further comprising:
a plurality of reactance elements arranged in parallel;
a plurality of switches arranged in parallel, each switch coupled in series with one of the plurality of reactance elements, such that AC current passing between the first and second terminals passes through those of the plurality of reactance elements coupled to switches that are in an on-state, each of the switches comprising:
a collector having a collector terminal;
an emitter having an emitter terminal, the emitter terminal not coupled to any emitter terminals of others of the plurality of switches;
a base having a base terminal, the base being coupled between the collector and the emitter, the base terminals of the plurality of switches being coupled directly or indirectly together;
the AC current passing at least partially through the collector and base terminals and a corresponding one of the plurality of reactance elements;

a biasing circuit coupled to at least the emitter terminal, and configured to forward bias a junction between the base and the emitter in the on-state and configured to cause a first amplitude of alternating current through the base terminal to be greater than a second amplitude of alternating current through the emitter terminal in the on-state.

2. The match network of claim 1, further comprising a controller configured to control the biasing circuit to selectively open and close each switch thereby selectively controlling a reactance of the match network.

3. The match network of claim 2, wherein the controller is further configured to control the biasing circuit to apply a direct current from the base to the emitter and thereby control an amplitude of alternating current between the collector terminal and the base terminal.

4. The match network of claim 1, wherein the one of the plurality of reactance elements is capacitive.

5. The match network of claim 1, wherein at least one of the plurality of switches is a bipolar junction transistor.

6. A match network comprising:
  at least one variable impedance-matching section comprising:
    a first terminal;
    a second terminal;
    a plurality of reactance elements, each of the plurality of reactance elements coupled to the first terminal;
    a plurality of switches, each of the plurality of switches coupled between a corresponding one of the plurality of reactance elements and the second terminal so that each of the plurality of reactance elements is selectively coupled between the first and second terminals, each of the plurality of reactance elements and a corresponding one of the plurality of switches forming a branch, the branches coupled in parallel, each branch switched into a reactance of the at least one variable impedance-matching section when the corresponding switch is in an on-state, each of the plurality of switches comprising:
      a collector having a collector terminal configured to pass a collector current with an alternating current component having a first amplitude;
      an emitter having an emitter terminal configured to pass an emitter current with an alternating current component having a second amplitude, the emitter terminal not coupled to any emitter terminals of others of the plurality of switches;
      a base having a base terminal, the base being coupled between the collector and the emitter, the base terminal configured to pass a base current with an alternating current component having a third amplitude, the base terminals of the plurality of switches being directly or indirectly coupled;
      a biasing circuit coupled to at least the emitter terminal, and configured to cause the third amplitude to be greater than the second amplitude during an on-state of the at least one switch;
    a controller configured to control the biasing circuits to selectively open and close one or more of the plurality of switches thereby selectively controlling a reactance of the at least one variable impedance-matching section.

7. The match network of claim 6, wherein the biasing circuit is configured to forward bias a junction between the base and the emitter during the on-state.

8. The match network of claim 6, wherein the one of the plurality of reactance elements is capacitive.

9. The match network of claim 6, wherein at least one of the plurality of switches is a bipolar junction transistor.

10. A plasma processing system comprising:
  a generator;
  a match network coupled to the generator and configured to be coupled between the generator and a plasma load, the match network comprising;
    a plurality of reactance elements arranged in parallel;
    a plurality of switches arranged in parallel, each of the switches coupled in series with one of the plurality of reactance elements, each switch comprising:
      a collector having a collector terminal configured to pass a collector current with an alternating current component having a first amplitude;
      an emitter having an emitter terminal configured to pass an emitter current with an alternating current component having a second amplitude;
      a base having a base terminal, the base being coupled between the collector and the emitter, the base terminal configured to pass a base current with an alternating current component having a third amplitude;
      a biasing circuit coupled to the collector terminal, the emitter terminal, and the base terminal, and configured to cause the third amplitude to be greater than the second amplitude; and
      an AC current loop including the collector and base terminals and one of the plurality of reactance elements.

11. The plasma processing system of claim 10, wherein each of the plurality of switches is configured to shunt alternating current through a corresponding one of the plurality of reactance elements when in an on-state and thereby change a reactance of the match network.

12. The plasma processing system of claim 10, further comprising a controller configured to control the biasing circuit to selectively open and close each switch thereby selectively controlling a reactance of the match network.

13. The plasma processing system of claim 10, wherein the controller is further configured to control the biasing circuit to apply a direct current from the base to the emitter and thereby control an amplitude of alternating current between the collector terminal and the base terminal.

14. The plasma processing system of claim 10, wherein the biasing circuit is configured to forward bias a junction between the base and the emitter during an on-state of a corresponding one of the switches.

15. The plasma processing system of claim 10, wherein the one of the plurality of reactance element is capacitive.

16. The plasma processing system of claim 10, wherein at least one of the plurality of switches is a bipolar junction transistor.

17. The match network of claim 1, wherein the base terminal is directly or indirectly coupled to a plasma load.

18. The match network of claim 6, wherein the base terminal is directly or indirectly coupled to a plasma load.

19. The match network of claim 10, wherein the base terminal is directly or indirectly coupled to a plasma load.

* * * * *